(12) United States Patent
Kobayashi

(10) Patent No.: US 11,702,746 B2
(45) Date of Patent: Jul. 18, 2023

(54) MAGNETIC DRIVE APPARATUS AND MAGNETIZING METHOD

(71) Applicant: TOKYO ELECTRON LIMITED, Tokyo (JP)

(72) Inventor: Takeshi Kobayashi, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/874,776

(22) Filed: May 15, 2020

(65) Prior Publication Data

US 2020/0370176 A1   Nov. 26, 2020

(30) Foreign Application Priority Data

May 22, 2019 (JP) ................................ 2019-096311

(51) Int. Cl.
| | | |
|---|---|---|
| C23C 16/458 | (2006.01) | |
| C23C 16/40 | (2006.01) | |
| C23C 16/455 | (2006.01) | |
| H02K 49/10 | (2006.01) | |
| H01L 21/687 | (2006.01) | |

(52) U.S. Cl.
CPC ........ *C23C 16/4584* (2013.01); *C23C 16/401* (2013.01); *C23C 16/45525* (2013.01); *C23C 16/45563* (2013.01); *H01L 21/68714* (2013.01); *H01L 21/68771* (2013.01); *H01L 21/68785* (2013.01); *H02K 49/102* (2013.01)

(58) Field of Classification Search
CPC ......... H01L 21/68714; H01L 21/68771; C23C 16/45546; C23C 16/4584; H02K 49/102; H02K 49/104
See application file for complete search history.

(56) References Cited

U.S. PATENT DOCUMENTS

| | | | | |
|---|---|---|---|---|
| 5,795,448 A | * | 8/1998 | Hurwitt | ................. C23C 14/505 204/192.12 |
| 2008/0122565 A1 | * | 5/2008 | Komura | ..................... H01F 1/40 335/284 |
| 2016/0096205 A1 | * | 4/2016 | Kato | ................. H01L 21/68792 134/21 |
| 2018/0037990 A1 | * | 2/2018 | Kato | .................... H01L 21/0228 |

FOREIGN PATENT DOCUMENTS

| | | |
|---|---|---|
| JP | H05-161341 A | 6/1993 |
| JP | H09-256820 A | 9/1997 |
| JP | 2013-059177 A | 3/2013 |
| JP | 2016-019365 A | 2/2016 |
| JP | 2017-139449 A | 8/2017 |
| JP | 2018-026528 A | 2/2018 |

* cited by examiner

*Primary Examiner* — Parviz Hassanzadeh
*Assistant Examiner* — Nathan K Ford
(74) *Attorney, Agent, or Firm* — Nath, Goldberg & Meyer; Jerald L. Meyer; Tanya E. Harkins

(57) ABSTRACT

There is provided a magnetic drive apparatus having a magnetic drive mechanism driven by a magnet. The magnetic drive apparatus includes a magnetizing yoke disposed in the magnetic drive apparatus at a standby position and configured to be moved to magnetize the magnet and a magnetizing yoke holder configured to hold the magnetizing yoke at a magnetizing position for magnetizing the magnet when the magnetic drive mechanism is stopped.

11 Claims, 17 Drawing Sheets

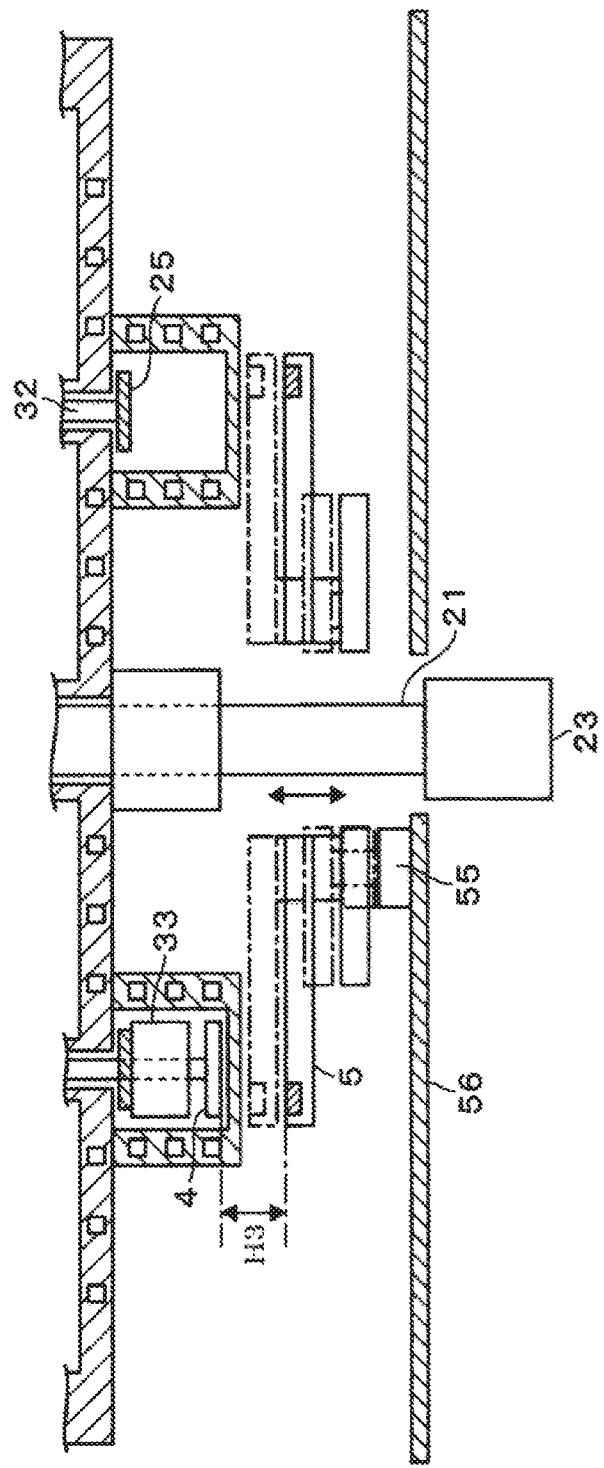

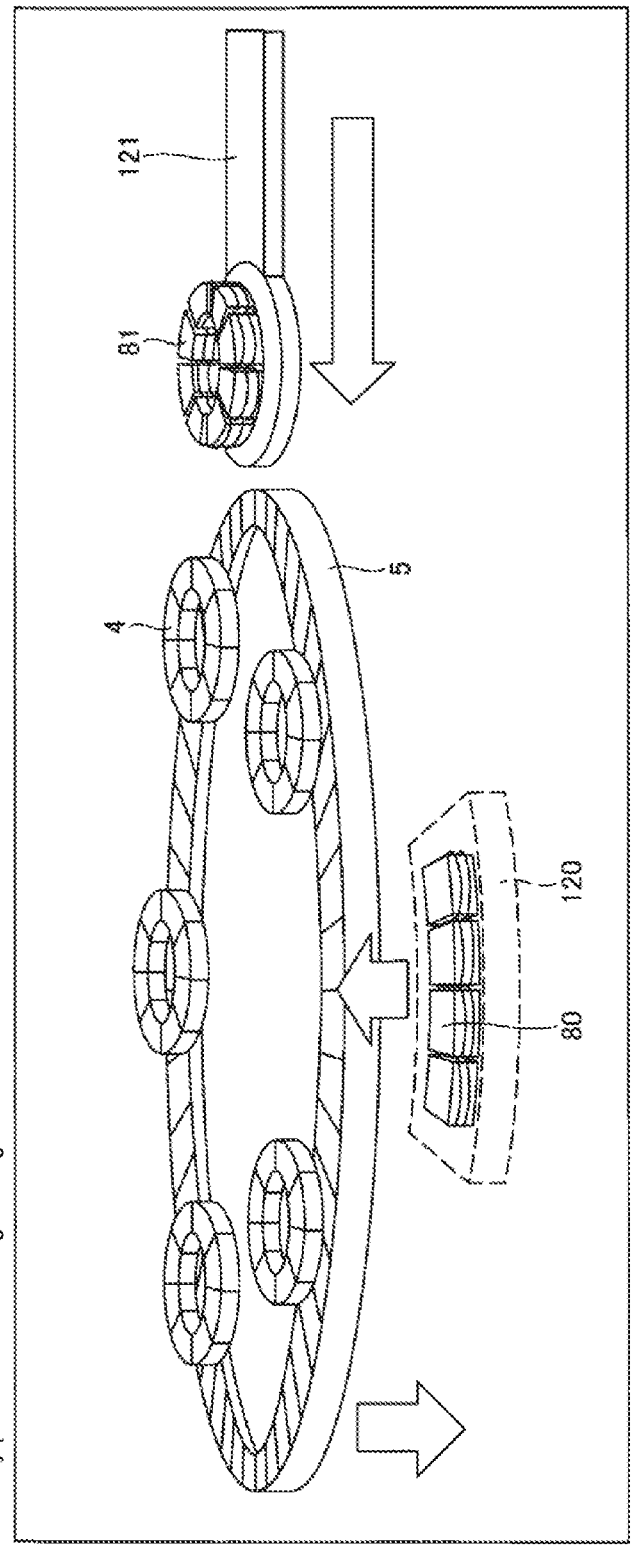

MAGNETIC DRIVE APPARATUS AND MAGNETIZING METHOD

CROSS-REFERENCE TO RELATED APPLICATION

This application is based upon and claims the benefit of priority from Japanese Patent Application No. 2019-096311, filed on May 22, 2019, the entire contents of which are incorporated herein by reference.

TECHNICAL FIELD

The present disclosure relates to a magnetic drive apparatus, a magnetizing method, and a method of manufacturing the magnetic drive apparatus.

BACKGROUND

There has been proposed a substrate processing apparatus in which a process is performed using a process gas while revolving a substrate mounted on a rotary table provided in a processing container, a mounting table on which the substrate is mounted is provided to be rotatable around a rotation axis extending in a direction along a rotary shaft of the rotary table, and a driven gear part of a magnetic gear mechanism rotates the mounting table about the rotation axis with movement of a line of magnetic force formed between the driven gear part and a driving gear part (see, e.g. Patent Document 1).

PRIOR ART DOCUMENTS

Patent Document

Patent Document 1: Japanese laid-open publication No. 2017-139449

SUMMARY

According to one embodiment of the present disclosure, there is provided a magnetic drive apparatus having a magnetic drive mechanism driven by a magnet, including a magnetizing yoke disposed in the magnetic drive apparatus at a standby position and configured to be moved to magnetize the magnet; and a magnetizing yoke holder configured to hold the magnetizing yoke at a magnetizing position for magnetizing the magnet when the magnetic drive mechanism is stopped.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is an explanatory view showing moving up and down of a driving gear.

FIG. 12 is a perspective view showing an example of a magnetizing yoke and a magnetizing yoke holding member in a magnetizing standby state.

DETAILED DESCRIPTION

Figure 1:
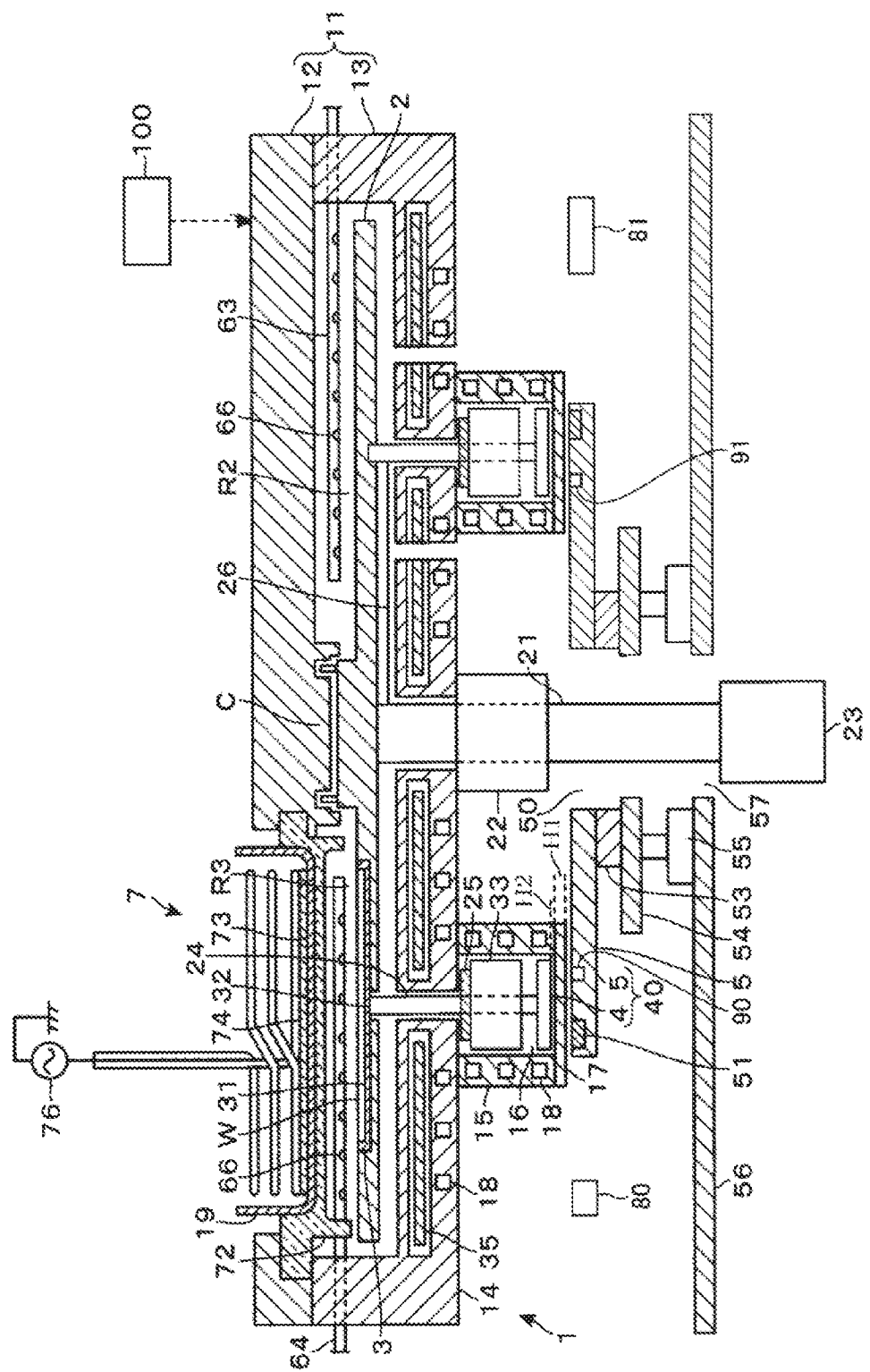
FIG. 1 is a longitudinal sectional side view of a film forming apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A magnetic drive apparatus according to an embodiment of the present disclosure will be described with reference to a longitudinal sectional side view of FIG. 1 and a plan view of FIG. 2. In the present embodiment, an example will be described in which the magnetic drive apparatus is configured as a substrate processing apparatus, particularly a film forming apparatus. However, the magnetic drive apparatus according to the present embodiment can be applied to various apparatuses that are magnetically driven using a magnet, and is not limited to the substrate processing apparatus and the film forming apparatus.

The film forming apparatus 1 according to the present embodiment is configured to perform Atomic Layer Deposition (ALD) that repeatedly and sequentially supplies a precursor gas containing silicon (Si) and an oxidizing gas to a wafer W mounted and revolved on a rotary table, which will be described later, and forms a silicon oxide ($SiO_2$) film by reacting the precursor gas and the oxidizing gas with each other.

The film forming apparatus 1 includes a vacuum container 11 which is a flat processing container having a substantially circular shaped cross section. The vacuum container 11 includes a container main body 13 that forms a side wall and a bottom portion of the container, and a ceiling plate 12. In the figures, reference numeral 2 denotes the above-mentioned rotary table provided in the vacuum container 11, which is formed in a horizontal disc shape. A rotary shaft 21 extending vertically downward is connected to a central portion of the rotary table 2. The rotary shaft 21 penetrates a bearing portion 22 installed on a bottom portion 14 of the container main body 13 and is connected to a revolution-purpose rotation mechanism 23 provided outside the vacuum container 11. The revolution-purpose rotation mechanism 23 causes the rotary table 2 to rotate, for example, clockwise when viewed from the top side.

In the bottom portion 14 of the container main body 13, a slit 24 having an annular shape in a plan view is formed to penetrate the bottom portion 14 in the thickness direction so as to surround the rotary shaft 21. A space forming portion 15 having an annular shape in a plan view and a concave shape in a longitudinal sectional view is formed below the bottom portion 14. The space inside the concave portion is partitioned from the outside of the vacuum container 11 and is exhausted through exhaust ports 36 and 37, which will be described later, to form a vacuum atmosphere at the time of performing the film forming process. Assuming that the space is a driven gear moving space 16, a horizontal annular supporting plate 25 is provided in the driven gear moving space 16 so as to be adjacent to the bottom portion 14 of the container main body 13. A bottom portion of the space forming portion 15 is formed of an annular horizontal plate which is referred to as a partition plate 17. The partition plate 17 serving as a partition member is made of a material through which a line of magnetic force formed between a driven gear 4 and a driving gear 5 to be described later passes, for example, aluminum or SUS (stainless steel). The thickness of the partition plate 17 is, for example, not more than 5 mm, more specifically, for example, not more than 3 mm. In the figures, reference numeral 18 denotes a coolant passage installed in the side wall and the bottom portion 14 of the space forming portion 15.

Subsequently, the structure of the rotary table 2 and each part attached to the rotary table 2 will be described with reference to FIG. 3 which is a schematic perspective view. Five spokes 26 extend and protrude radially from an upper end portion of the bearing portion 22 in a plan view, and the rotary table 2 is supported by the spokes 26. The spokes 26 are made of, for example, an alloy such as Inconel® so as to have high strength and high heat resistance. Leading end portions of the spokes 26 are bent downwardly through the slit 24 of the container main body 13 and is connected to the upper surface of the annular supporting plate 25. Therefore, the annular supporting plate 25 supports the rotary shaft 21 by the spokes 26.

A mounting table 3 having a circular shape in a plan view and revolving by the rotation of the rotary table 2 is installed on an upper surface side (one surface side) of the rotary table 2. In this example, five mounting tables 3 are installed along the rotation direction of the rotary table 2. A concave portion 31 for horizontally mounting and storing the wafer W is formed on the upper surface of the mounting table 3.

A rotation axis 32 that supports the mounting table 3 is installed at a central portion on a lower surface side of each mounting table 3 so as to extend and protrude vertically downward. Each rotation axis 32 penetrates the annular supporting plate 25 and penetrates each of five bearing units 33 (only four are shown in FIG. 3) supported and installed on the lower surface of the annular supporting plate 25. The position where the rotation axis 32 penetrates the annular supporting plate 25 is between the adjacent spokes 26 when the annular supporting plate 25 is viewed in the circumferential direction. That is, the rotation axis 32 and the spokes 26 are alternately arranged on the annular supporting plate 25. Each bearing unit 33 includes a bearing surrounding the rotation axis 32 so as to rotatably hold and support the rotation axis 32, and a magnetic seal for preventing particles from scattering from the bearing. With such a configuration, the rotation axis 32 is rotatably installed at a portion that rotates together with the rotary table 2. Further, the rotation axis 32 is supported by the bearing unit 33, and the bearing unit 33 is supported by the rotary shaft 21 via the annular supporting plate 25 and the spokes 26.

A horizontal disc-shaped driven gear 4 is provided at the lower end of the rotation axis 32 in a state where the center axis of the driven gear 4 is aligned with the center axis of the rotation axis 32. Therefore, the driven gear 4 is connected to the mounting table 3 via the rotation axis 32, and the driven gear 4 revolves in the horizontal direction around the rotary shaft 21 of the rotary table 2 by the rotation of the rotary table 2. When the driven gear 4 is rotated in the circumferential direction, each mounting table 3 rotates around the rotation axis 32. The distance H2 between the driven gear 4 and the partition plate 17 shown in FIG. 1 is, for example, 1 mm.

Figure 4:
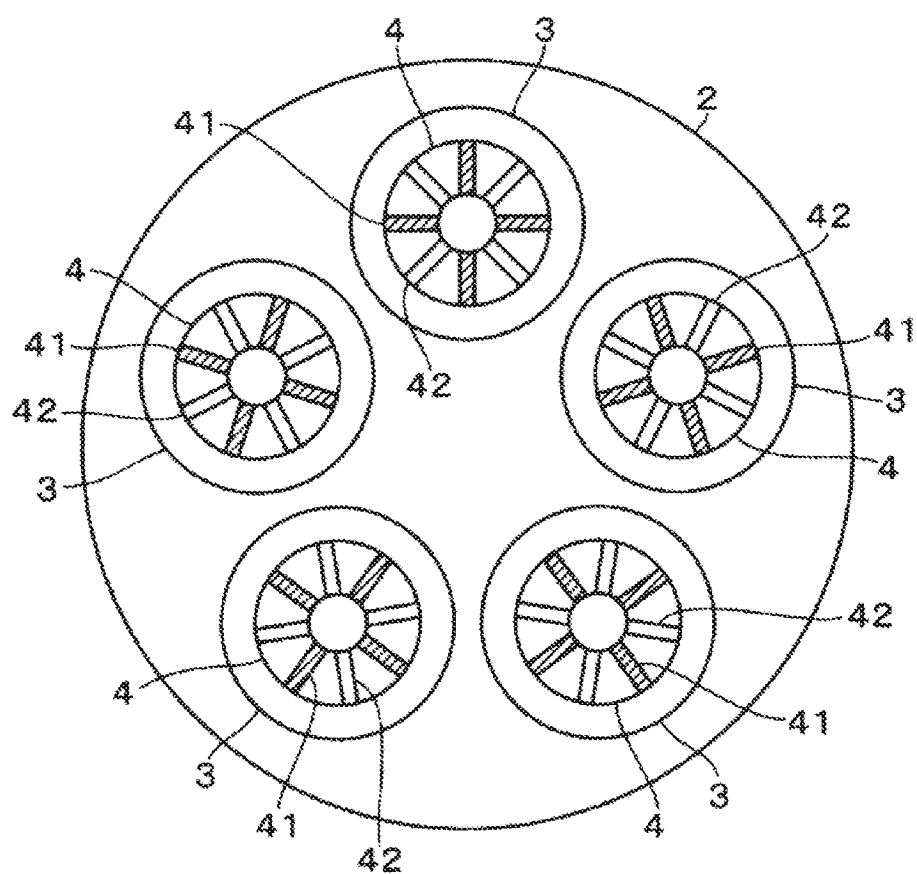
FIG. 4 is a bottom view schematically showing a driven gear provided on a lower surface of a mounting table.

FIG. 4 schematically shows the lower surface side of the driven gear 4. A large number of permanent magnets (a first magnet) are embedded over the entire circumstance on the lower side of the driven gear 4 along the rotation direction of the driven gear 4. The provision of the permanent magnet over the entire circumference here means that the area where the permanent magnet is provided is not local when viewed in the rotational direction. Therefore, even if there is a gap between permanent magnets adjacent to each other in the rotation direction, the permanent magnets are provided over the entire circumference. In this example, such a gap is provided.

Assuming that the magnetic poles of the permanent magnets provided on the driven gear 4 are an N-pole portion 41 and an S-pole portion 42, when the driven gear 4 is viewed from the lower surface side, the N-pole portion 41 and the S-pole portion 42 are arranged alternately along the rotation direction (rotary direction). In addition, the N-pole portion 41 is shown with oblique lines in the figure in order to distinguish it from the S-pole portion 42. In this example, the N-pole portion 41 and the S-pole portion 42 exposed on the lower surface of the driven gear 4 are formed in the same strip shape. For example, 18 N-pole portions 41 and 18 S-pole portions 42 are arranged at intervals in the circumferential direction so as to extend radially in the lateral direction from a central portion of the lower surface of the driven gear 4. The lengths of the N-pole portion 41 and the S-pole portion 42 are set to be shorter than the radius of the driven gear 4 so as not to exceed the center of the bottom surface of the driven gear 4, for example. In order to suppress demagnetization in a high-temperature environment, the permanent magnets forming the driven gear 4 and the permanent magnets forming the driving gear 5 to be described later are formed of, for example, a samarium-cobalt magnet.

Figure 3:
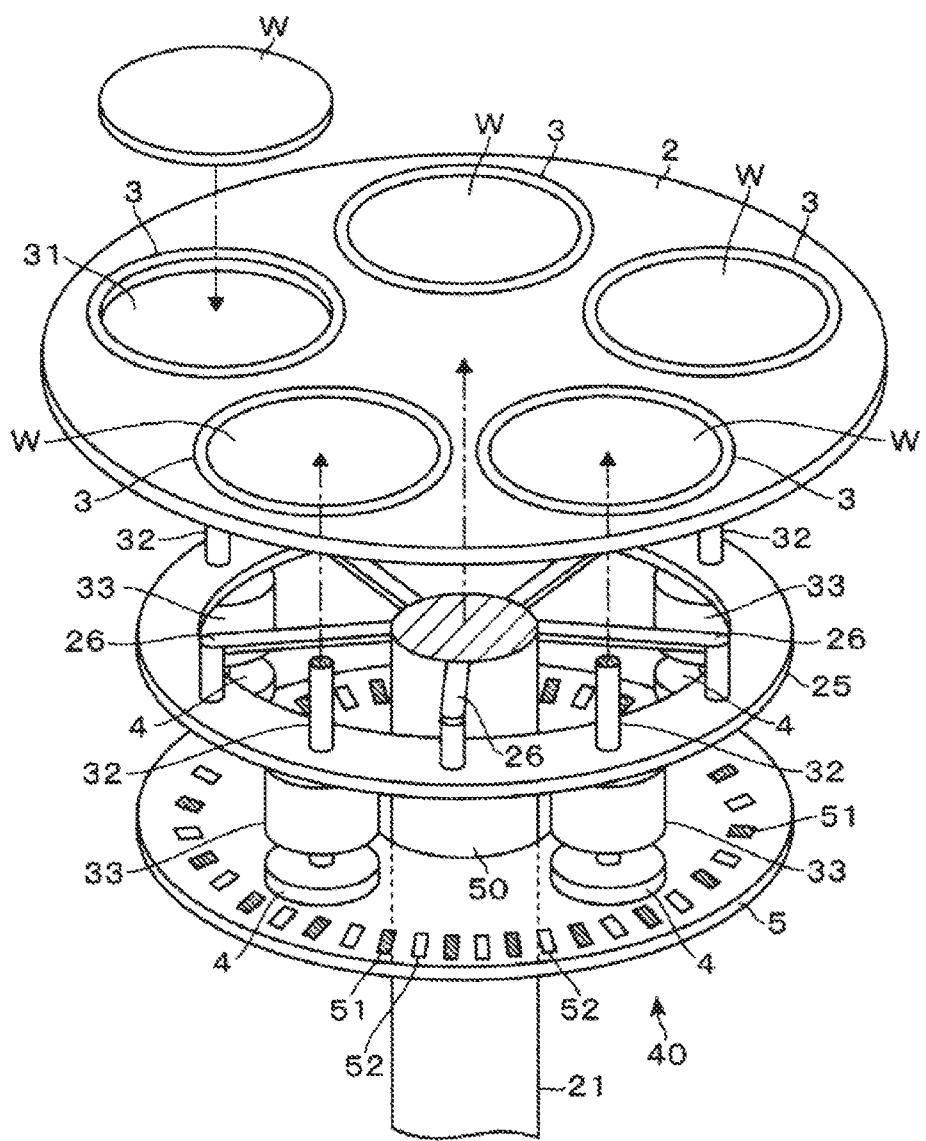
FIG. 3 is a schematic perspective view of a rotary table installed in the film forming apparatus.

As shown in FIGS. 1 and 3, the driving gear 5 is disposed outside the vacuum container 11 (the air atmosphere side) and below the space forming portion 15. The driving gear 5 forms a magnetic gear mechanism 40 together with the driven gear 4. The driving gear 5 is a horizontal annular plate formed along the entire circumference of the revolution orbit of the driven gear 4 and is provided so as to face the revolution orbit. Therefore, the upper surface of the driving gear 5 faces the lower surface of the driven gear 4.

In the figures, reference numeral 50 is a circular opening portion formed at the center of the driving gear 5, and the center of the opening portion 50 coincides with the rotary center of the rotary table 2 in a plan view. As shown in FIG. 1, a rotation-purpose rotation mechanism 53 for rotating the driving gear 5, such as an annular direct drive motor (DD motor), is provided on the lower surface of the driving gear 5 so as to surround the rotary shaft 21, and the driving gear 5 is rotated with the center of the opening portion 50 as a rotation center by the rotation-purpose rotation mechanism 53. Therefore, the driving gear 5 is rotated in a state where it faces the revolution orbit of the driven gear 4. The rotation-purpose rotation mechanism 53 for rotating is provided on an annular elevating table 54 that surrounds the rotary shaft in a plan view. The elevating table 54 is elevated by a driving gear elevating mechanism 55. In the figure, reference numeral 56 denotes a horizontal floor plate on which a driving gear elevating mechanism 55 is provided, which has an opening portion 57 through which the rotary shaft 21 passes.

Figure 5:
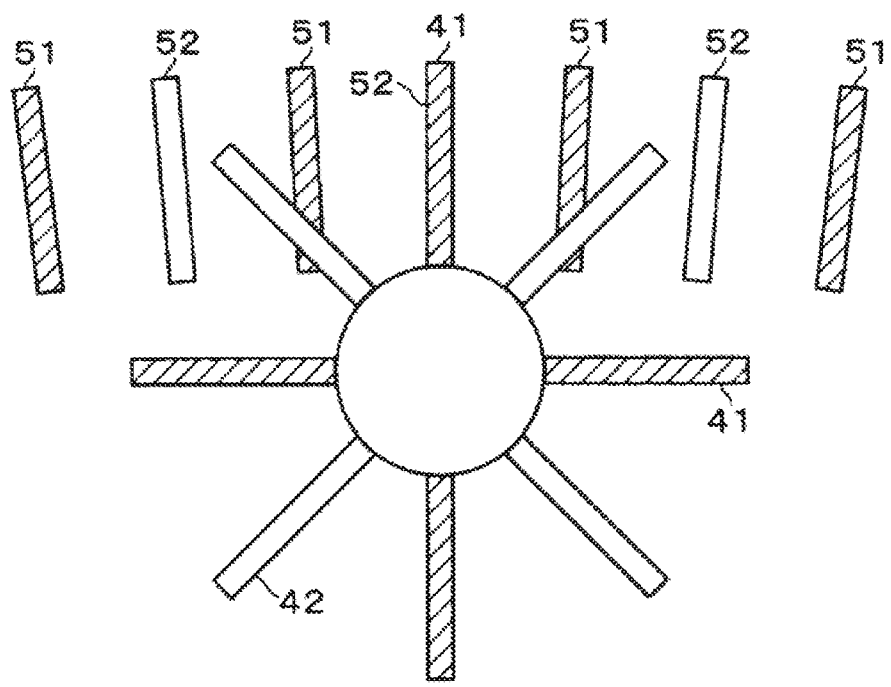
FIG. 5 is a plan view showing a portion of a driven gear and a driving gear.

The driving gear 5 will be described in more detail. Permanent magnets (a second magnet) are embedded in the upper portion of the driving gear 5 over the entire circumference of the driving gear 5 so as to face the outer peripheral edge of the resolution orbit of the driven gear 4. Here, the provision of the permanent magnets over the entire circumference means that the area where the permanent magnets are provided is not local when viewed in the rotation direction of the driving gear 5, and it is not to be provided without a gap between permanent magnets in the rotation direction. In this example, such a gap is provided between permanent magnets adjacent in the rotation direction. Assuming that the magnetic poles of the permanent magnets provided on the driving gear 5 are an N-pole portion 51 and an S-pole portion 52, the N-pole portion 51 and the S-pole portion 52 are arranged alternately in the rotation direction of the driving gear 5 when the driving gear 5 is viewed from the top side. In FIG. 3 and FIG. 5 to be described later, the N-pole portion 51 is shown with oblique lines in the figures, similarly to the N-pole portion 41 of the driving gear 5.

FIG. 5 shows the correspondence between the magnetic pole portions (N-pole portion 41 and S-pole portion 42) of one driven gear 4 and the magnetic pole portions (N-pole portion 51 and S-pole portion 52) of the driving gear 5 therebelow. For example, the N-pole portion 51 and the S-pole portion 52 are formed in a strip shape so as to overlap the shapes of the N-pole portion 41 and the S-pole portion 42 formed on the lower surface of the driven gear 4. In addition, FIG. 5 shows a state where the N-pole portion 41 of the driven gear 4 and the S-pole portion 52 of the driving gear 5 overlap and face each other, and are magnetically coupled to each other in a non-contact manner. Since FIG. 5 and FIGS. 6 and 7 to be described later are schematic views for explaining the configuration of the magnetic gear, the number of magnetic pole portions is different from the number of magnetic pole portions of an actual apparatus.

Figure 6:
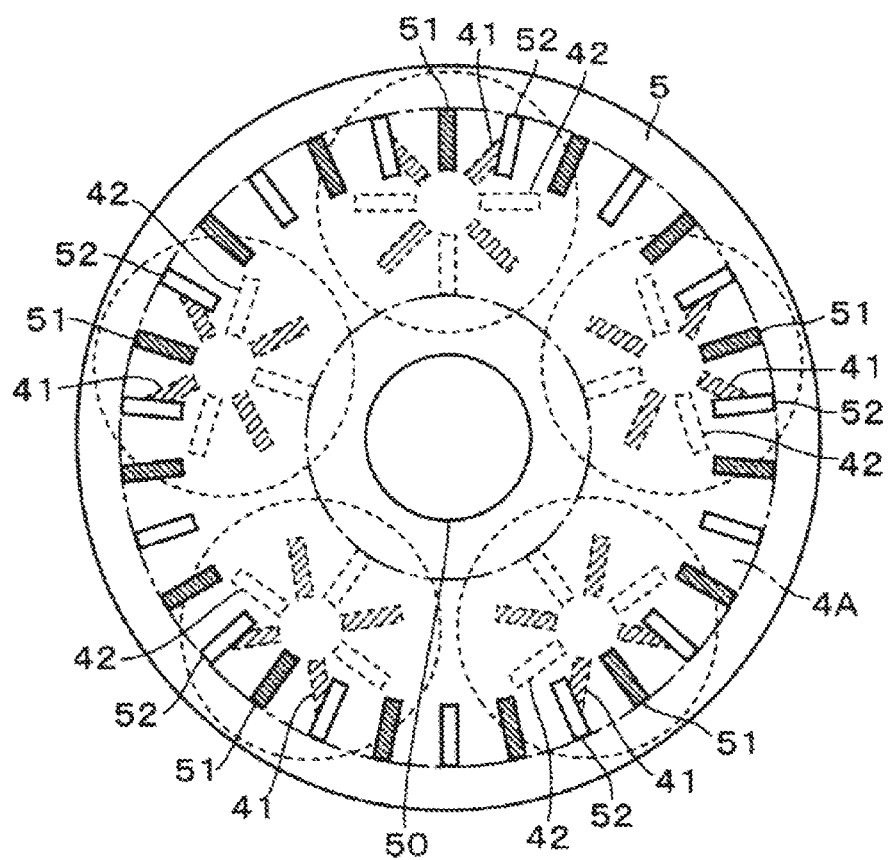
FIG. 6 is a plan view schematically showing a driven gear and a driving gear.
Figure 7:
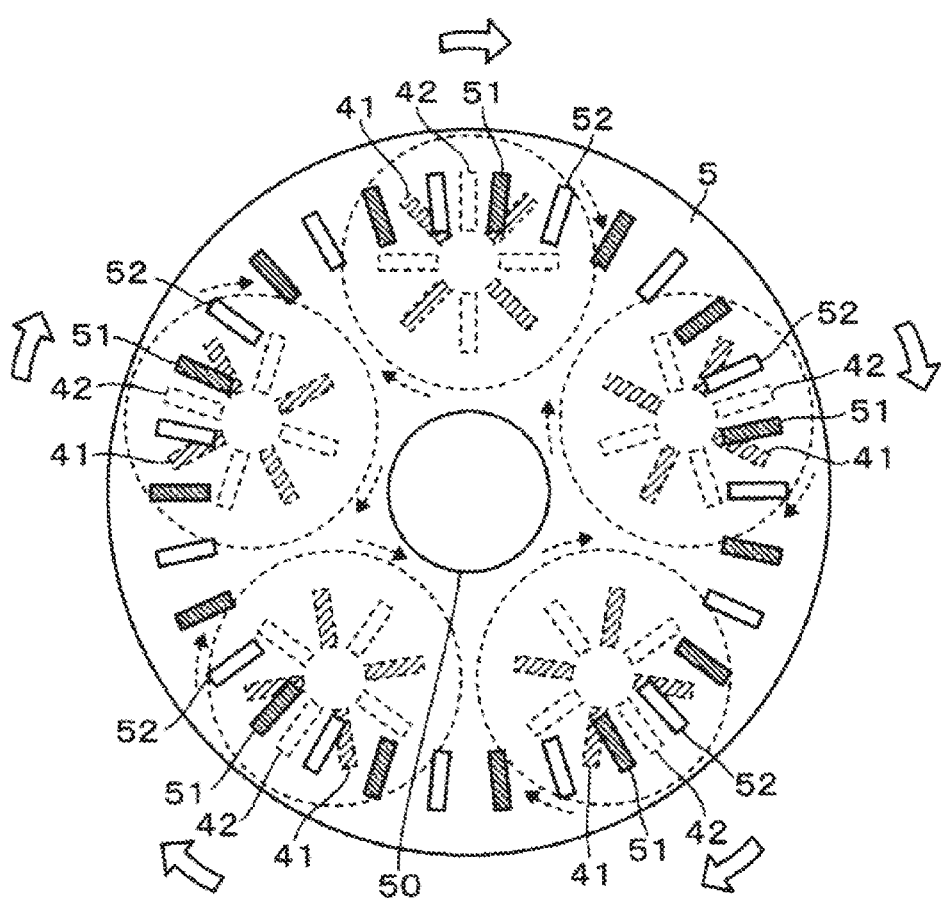
FIG. 7 is a plan view schematically showing a driven gear and a driving gear.

Subsequently, the revolution and rotation of the mounting table 3 will be described. FIG. 6 shows a state in which some of five driven gears 4 are stopped to face the driving gear 5 in a state in which the rotary table 2 and the driving gear 5 are stopped (a state in which they are not rotated). The driven gears 4 are stopped at a position determined by the total action of an attractive force and a repulsive force between each magnetic pole portion (N-pole portion 41 and S-pole portion 42) of the driven gears 4 and each magnetic pole portion (N-pole portion 51 and S-pole portion 52) of the driving gear 5. Therefore, when the rotary table 2 and the driving gear 5 are rotated at the same rotational number (rotational speed: rpm), the driven gears 4 are stopped relatively to the driving gear 5, so that the driven gears 4, that is, the mounting table 3, is stopped without rotating.

When there is a difference in rotation number between the driving gear 5 and the rotary table 2, that is, a speed difference occurs between the angular speed of the driving gear 5 and the angular speed of the driven gear 4 due to the rotation of the rotary table 2 (so-called revolving angular speed), the mounting table 3 is rotated. When the angular speed Va of the driving gear 5 is higher than the angular speed Vb of the driven gear 4 (when the speed difference obtained by subtracting the angular speed of the driven gear 4 from the angular speed of the driving gear 5 is positive), the arrangement of the N-pole portion 51 and the S-pole portion 52 of the driving gear 5 moves from the left to the right in FIG. 5 below the arrangement of the N-pole portion 41 and S-pole portion 42 of the driven gear 4 opposing the driving gear 5. For this reason, the repulsive force and the attractive force from the driving gear 5 acting on the driven gear 4 move to the right, and the arrangement of the N-pole portion 41 and the S-pole portion 42 of the driven gear 4 is also dragged to the right. As a result, the driven gear 4 is rotated in the right in FIG. 5, that is, clockwise such as from the state shown in FIG. 6 to the state shown in FIG. 7. In FIG. 6, the resolution orbit of the ring-shaped driven gear 4 is shown as 4A.

When the angular speed Va of the driving gear 5 is smaller than the angular speed Vb of the driven gear 4 (when the speed difference obtained by subtracting the angular speed of the driven gear 4 from the angular speed of the driving gear 5 is minus), the arrangement of the N-pole portion 51 and the S-pole portion 52 of the driving gear 5 moves from the right to the left in FIG. 5 below the arrangement of the N-pole portion 41 and S-pole portion 42 of the driven gear 4 opposing the driving gear 5. For this reason, the repulsive force and the attractive force from the driving gear 5 acting on the driven gear 4 move to the left, and the arrangement of the N-pole portion 41 and the S-pole portion 42 of the driven gear 4 is also dragged to the left. As a result, the driven gear 4 is rotated in the left in FIG. 5, that is, counterclockwise.

Figure 8:
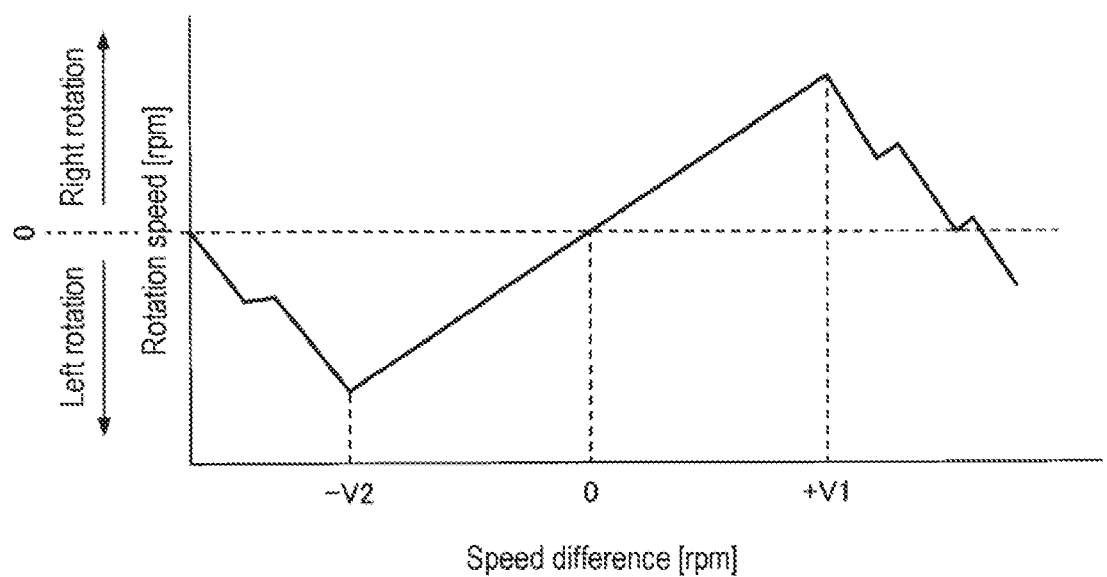
FIG. 8 is a characteristic diagram showing a relationship between a rotation speed of a driven gear and a difference between an angular speed of the driven gear and an angular speed of a driving gear.

The speed difference between the angular speed of the driven gear 4 due to the revolution and the angular speed of the driving gear 5 and the rotation speed of the driven gear 4 maintain substantially a proportional relationship in a certain speed difference range as shown in FIG. 8. In FIG. 8, the horizontal axis represents the speed difference (Va−Vb) between the angular speed Va of the driving gear 5 and the angular speed Vb of the driven gear 4 due to the revolution, and the vertical axis represents the rotation speed of the driven gear 4. When the speed difference is positive ((Va−Vb)>0), the clockwise rotation speed increases as the speed difference increases from zero to +V1, When the speed difference is negative ((Va−Vb)<0), the counterclockwise rotation speed increases as the speed difference increases from zero to −V2. For example, the angular speed of the driving gear 5 is set to a value at which the speed difference and the rotation speed of the driven gear 4 maintain substantially a proportional relationship.

In this manner, the mounting table 3 is rotated when a difference in rotation number occurs between the driving gear 5 and the rotary table 2. At this time, the rotation speed can be obtained by multiplying the gear ratio of the driving gear 5 and the driven gear 4 by difference in rotation speed of the driving gear 5 and the driven gear 4. The rotation speed difference is a speed difference between the angular speed of the driving gear 5 and the angular speed of the driven gear 4 due to the rotation of the rotary table 2

(so-called revolving angular speed). In the case where the driving gear 5 is constituted by 300 magnetic pole portions (N-pole portion 51 and S-pole portion 52) and the driven gear 4 is constituted by 18 magnetic pole portions (N-pole portion 41 and S-pole portion 42), for example, when the rotation number of the rotary table 2 is 30 rpm, the rotation speed when the driving gear 5 is 0.1 degree/second (6 degree/minute) can be obtained as follows. Since the gear ratio is 300/18=16.67 and the rotation speed difference is 6/360 rpm, the rotation speed of the driven gear 4 is 300/18×6/360=0.278 rpm (100 degrees/minute) by the gear ratio×the rotation speed difference.

The above-described relationship between the rotation speed of the driven gear 4 shown in FIG. 8 and the speed difference between the angular speed (revolving speed) of the driven gear 4 due to the resolution and the angular speed of the driving gear 5 is stored in a memory of a controller 100 to be described later. For example, when performing a film forming process or maintenance of the apparatus, a user of the film forming apparatus 1 inputs the rotation speed of the driven gear 4 and the rotation number of the rotary table 2 from an input part 104 of the controller 100 to determine the rotation number of the driving gear 5 based on these input parameters and the above-described relationship stored in the memory and rotate the driving gear 5 with the determined rotation number.

The driving gear 5 is moved up and down as shown in FIG. 9 by the driving gear elevating mechanism 55 which is the relative distance changing mechanism. Thus, a process can be performed on the wafer W by changing the separation distance H3 between the driving gear 5 and the resolution orbit of the driven gear 4. This separation distance H3 is changed within a range of, for example, 1 mm to 5 mm. The reason why the apparatus is configured so that the separation distance H3 can be changed will be described. As described above, the driven gear 4 and the driving gear 5 are constituted by permanent magnets, and the permanent magnets are demagnetized according to the environmental temperature. Therefore, for example, even if the driven gear 4 is rotated due to the rotation of the driving gear 5 without any problem as described with reference to FIG. 7 at around room temperature, when the environmental temperature of the driven gear 4 and the driving gear 5 becomes relatively high during the film forming process by setting the processing temperature of the wafer W to be relatively high, the driven gear 4 may not be rotated due to this demagnetization. In addition, the higher the rotation number of the rotary table 2, that is, the higher the revolution speed of the rotation axis 32, the greater the centrifugal force applied to the rotation axis 32. Therefore, the rotation axis 32 presses a part of the bearing that forms the inner peripheral wall of the bearing unit 33 toward the outside of the rotary table 2, and a load on the part increases. That is, the minimum torque required for rotating the rotation axis 32 changes according to the rotation number of the rotary table 2.

Therefore, it is conceivable that the magnetic force between the driven gear 4 and the driving gear 5 is made relatively strong so that the torque required for the rotation can be obtained even when the rotation number of the rotary table 2 is high. However, when a strong magnetic force always acts between the driven gear 4 and the driving gear 5, since the magnetic pole portion (N-pole portion 51 and S-pole portion 52) of the driving gear 5 is provided so as to face the periphery of the revolving orbit of the driven gear 4 as described above, the rotation axis 32 presses a part of the bearing of the bearing unit 33 toward the outside of the rotary table 2 by the action of the magnetic force, and the load on the part increases. Further, the rotation axis 32 and the mounting table 3 are strongly pulled downward by the magnetic force, so that a load on the rotary table 2 increases and a load on the rotary shaft 21 increases. That is, there is a possibility that the timing at which the rotary table 2, the rotary shaft 21 and the bearing unit 33 are damaged may be advanced. Therefore, the film forming apparatus 1 is configured so that the magnetic force between the driving gear 5 and the driven gear 4 can be made necessary and appropriate by adjusting the above-mentioned separation distance H3.

However, even if such a driving gear elevating mechanism 55 is provided to adjust the magnetic force, the permanent magnets used in the driven gear 4 and the driving gear 5 have a Curie temperature, above of which the properties of the ferromagnetic material are lost (for example, 750 degrees C. for iron); if the film forming process is continued at a higher temperature, the magnetic force of the permanent magnets gradually decreases. For example, when a process of high temperature such as 600 degrees C., 650 degrees C. or 700 degrees C. is performed many times, even if the temperature is lower than the Curie temperature, the magnetic force gradually decreases due to heating deterioration.

When the permanent magnets used in the driven gear 4 and the driving gear 5 deteriorate to decrease the magnetic force, the rotation characteristics change over time, so that the film forming uniformity may gradually decrease with the change of the rotation characteristics (rotation speed and the like). That is, the rotation may be insufficient to reduce the in-plane uniformity of the film forming process.

Thus, the film forming apparatus 1 according to the present embodiment includes a drive gear magnetizing yoke 80 for magnetizing the permanent magnet of the driving gear 5 and a driven gear magnetizing yoke 81 for magnetizing the permanent magnet of the driven gear 4.

The driving gear magnetizing yoke 80 and the driven gear magnetizing yoke 81 are disposed (waiting) at predetermined standby positions outside the driving gear 5 and the driven gear 4 during the film forming process. When the magnetic force of the permanent magnet decreases, the driving gear elevating mechanism 55 is lowered to form a space between the partition plate 17 and the driving gear 5, and the driving gear magnetizing yoke 80 and/or the driven gear magnetizing yoke 81 is inserted and magnetized in the space.

The specific operations will be described with reference to FIGS. 10A, 10B, 11A and 11B.

Figure 10A:
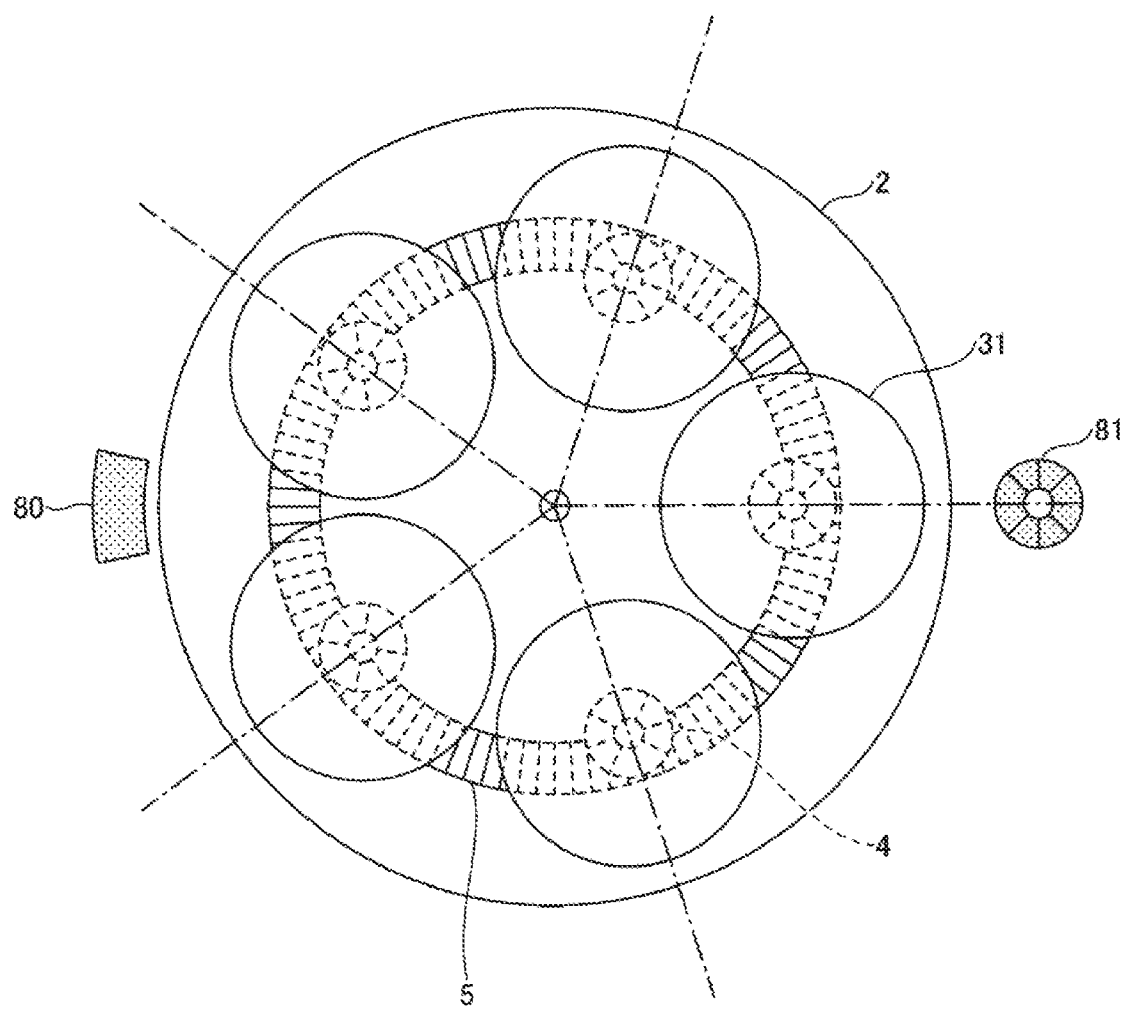
FIGS. 10A and 10B are views showing a standby state of a magnetizing yoke during a normal operation.
Figure 10B:
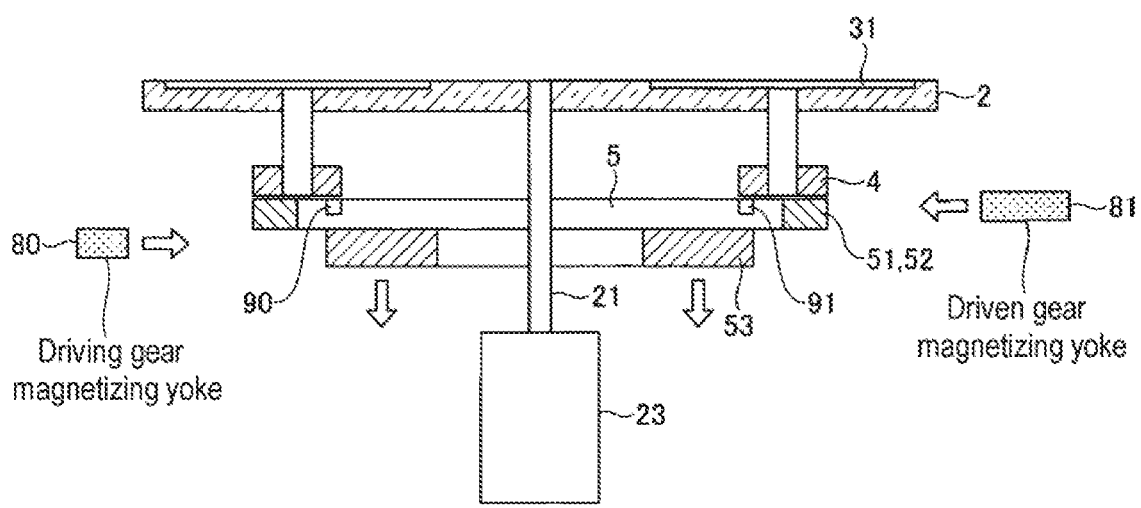

FIGS. 10A and 10B are views showing a standby state of a magnetizing yoke during the normal operation. FIG. 10A is a transparent plan view of the rotary table during the normal operation, and FIG. 10B is a sectional view of the rotary table during the normal operation.

As shown in FIG. 10A, during the film forming process, the driving gear magnetizing yoke 80 and the driven gear magnetizing yoke 81 are retracted outside the outer shape of the rotary table 2 to be located at a position that does not interfere with the film forming process.

As shown in FIG. 10B, the driving gear magnetizing yoke 80 is located outside the driving gear 5 and the driven gear 4, and is disposed at a position at which it can face the permanent magnet of the driving gear 5 when the driving gear 5 is lowered and the driving gear magnetizing yoke 80 is moved to the center side. Similarly, the driven gear magnetizing yoke 81 is also located outside the driving gear 5 and the driven gear 4, and is disposed at a position at which it can face driven gear 4 when the driving gear 5 is lowered and the driven gear magnetizing yoke 81 is moved to the center side.

During the film forming process, the driving gear magnetizing yoke 80 and the driven gear magnetizing yoke 81 are arranged as shown in FIGS. 10A and 10B at positions not interfering with the revolving and rotating operations of the rotary table 2 and the mounting table 31 during the film forming process.

Note that magnetic force detectors 90 and 91 that can measure the magnetic forces of the driving gear 5 and the driven gear 4 may be provided as necessary. In FIG. 10B, the magnetic force detectors 90 and 91 are provided on the driving gear 5, but they may be arranged at various positions if the magnetic force of the driving gear 5 and/or the driven gear 4 can be measured. In addition, the magnetic force detectors 90 and 91 having various configurations can be used.

The magnetic force detectors 90 and 91 are not indispensable. The magnetic force detectors 90 and 91 may be configured to execute a film forming process a plurality of times and make magnetization after a predetermined time has elapsed. Similar to the driving gear magnetizing yoke 80 and the driven gear magnetizing yoke 81, the magnetic force detectors may be inserted from the outside to measure the magnetic forces of the driving gear 5 and the driven gear 4 regularly.

Figure 11A:
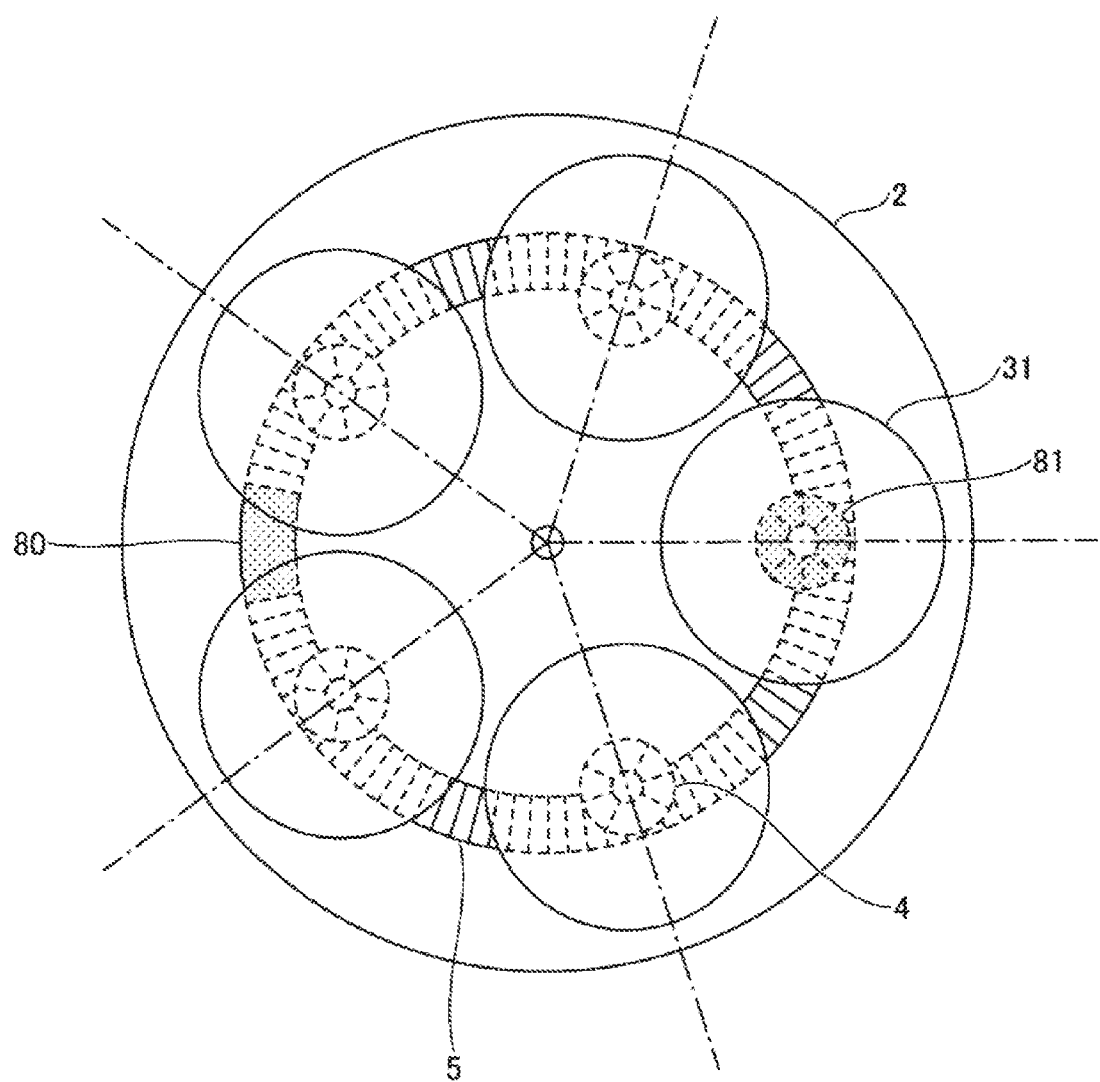
FIGS. 11A and 11B are views showing a state of a magnetizing yoke when magnetizing is performed.
Figure 11B:
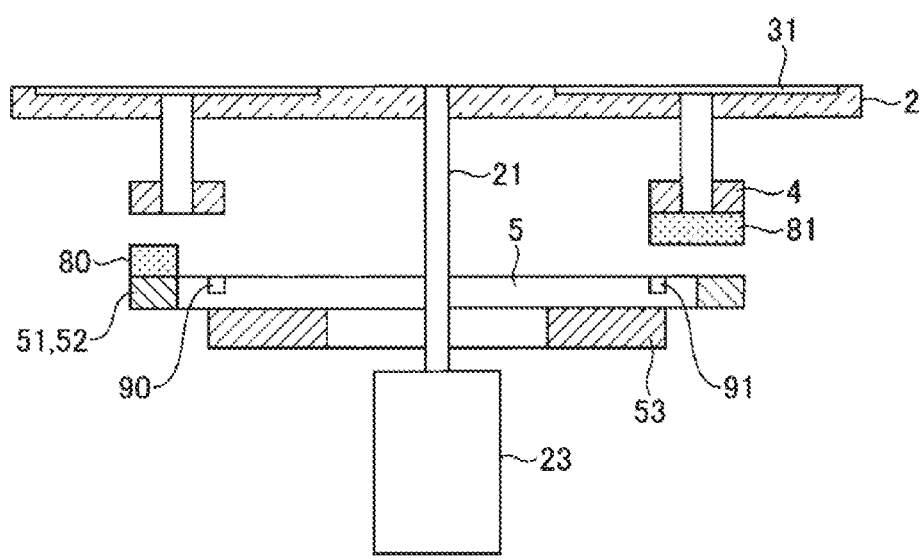

FIGS. 11A and 11B are views showing a state of the magnetizing yoke when magnetizing is performed. FIG. 11A is a transparent plan view around the rotary table during the normal operation, and FIG. 11B is a sectional view around the rotary table during the normal operation.

As shown in FIG. 11A, when magnetizing is performed, the driving gear magnetizing yoke 80 is disposed so as to overlap the driving gear 5, and the driven gear magnetizing yoke 81 is disposed so as to overlap the driven gear 4. That is, from the state of FIG. 10A, the driving gear magnetizing yoke 80 and the driven gear magnetizing yoke 81 move toward the center of the rotary table 2, and the driving gear magnetizing yoke 80 and the driven gear magnetizing yoke 81 move in the horizontal direction so as to face the driving gear 5 and the driven gear 4.

As shown in FIG. 11B, the driving gear 5 faces the driving gear magnetizing yoke 80, and the driven gear 4 faces the driven gear magnetizing yoke 81. The driving gear magnetizing yoke 80 and the driven gear magnetizing yoke 81 are electromagnets, and when a large current is applied at once, the permanent magnets facing the electromagnets are magnetized to recover the magnetic force. The N-pole permanent magnet is arranged so as to face the S-pole magnetizing yoke, the S-pole permanent magnet is arranged so as to face the N-pole magnetizing yoke, and a large current flows to magnetize the N-pole and the S-pole.

In FIG. 11B, a distance between the driving gear 5 and the driving gear magnetizing yoke 80 and a distance between the driven gear 4 and the driven gear magnetizing yoke 81 are not specified, but the driving gear 5 and the driving gear magnetizing yoke 80 are very close to each other and the driven gear 4 and the driven gear magnetizing yoke 81 are very close to each other. In this state, the driving gear magnetizing yoke 80 and the driven gear magnetizing yoke 81 are arranged such that a gap exists between the driving gear 5 and the driving gear magnetizing yoke 80, and a gap exists between the driven gear 4 and the driven gear magnetizing yoke 81. If the magnetizing yoke come into contact with the permanent magnets, since the magnets cannot be magnetized, a gap is left between the magnetizing yoke and the permanent magnet, but if the gap is too large, the magnetizing effect will be reduced. Therefore, the magnetizing yoke and the permanent magnet are arranged to face each other so as to have an extremely small distance, and the magnetization is performed.

As shown in FIG. 11A, since the driving gear magnetizing yoke 80 can magnetize only a part of the driving gear 5, the driving gear 5 can be magnetized by shifting the driving gear 5 little by little over the entire circumference of the driving gear 5. As a result, the entire driving gear 5 can be uniformly magnetized, thereby restoring the magnetic force of the permanent magnet.

Similarly, since the driven gear magnetizing yoke 81 can magnetize only one driven gear 4 at a time, in the example of FIGS. 11A and 11B, the driven gear 4 is shifted to magnetize all of the five driven gears 4. Thereby, all the driven gears 4 can be uniformly magnetized.

The magnetization is performed when the film forming process is not performed. Specifically, for example, the magnetization is performed after one run of the film forming process is completed and the wafer W is unloaded before the next wafer W is loaded. That is, it is preferable to perform the magnetization in a state where the wafer W does not exist in the vacuum container 11.

As described above, the timing at which the magnetization is performed may be managed by time, or the magnetic force may be constantly monitored using the constantly-monitoring magnetic force detectors 90 and 91 to perform the magnetization when the magnetic force is less than a predetermined threshold value, or is equal to or less than a predetermined threshold value. Further, after the lapse of a predetermined period, the magnetic force of the permanent magnet may be measured by an insertion type magnetic force detector, and a comparison with a threshold value may determine whether to perform the magnetization.

FIG. 12 is a perspective view showing an example of a magnetizing yoke and a magnetizing yoke holding member in a magnetizing standby state. As shown in FIG. 12, the driving gear magnetizing yoke 80 and the driven gear magnetizing yoke 81 are supported by the magnetizing yoke holding members 120 and 121, respectively, and are disposed (waiting) outside the driving gear 5 and the driven gear 4.

The magnetizing yoke holding members 120 and 121 are configured to be movable by a moving unit (moving mechanism, not shown) so that the driving gear magnetizing yoke 80 and the driven gear magnetizing yoke 81 can be moved between the standby position and the magnetizing position using automatic control.

Figure 13:
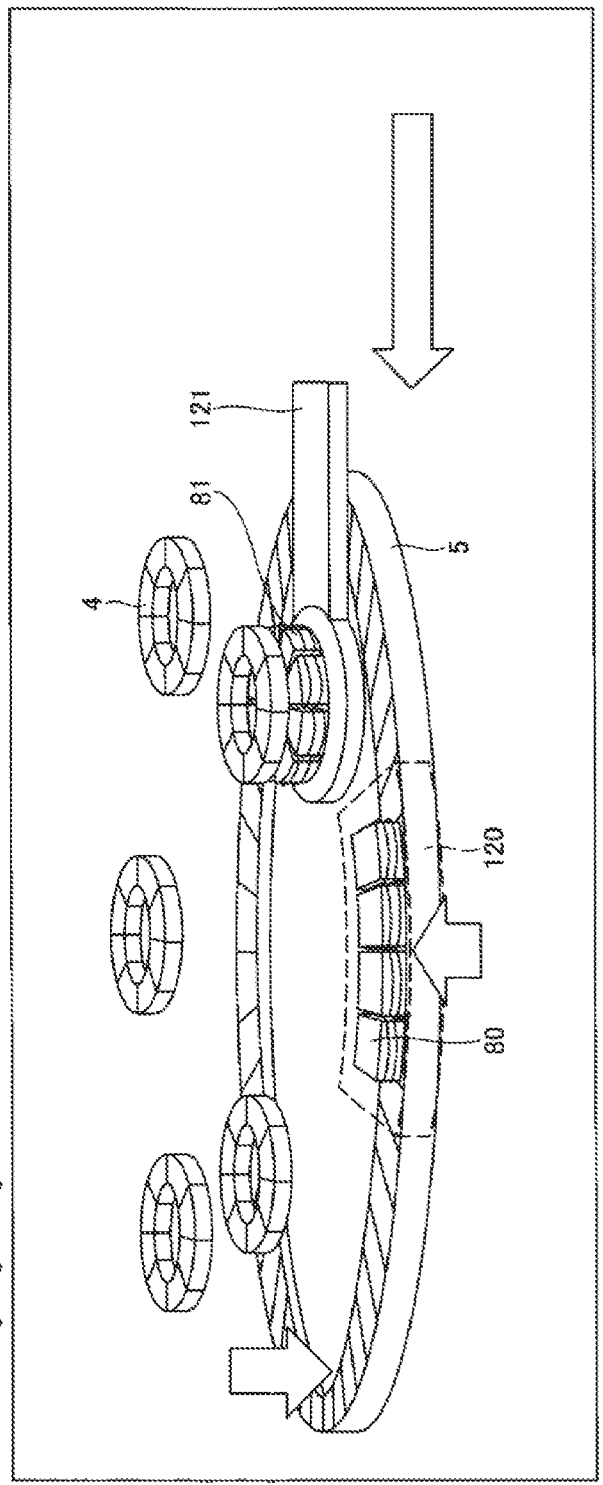
FIG. 13 is a perspective view showing an example of a magnetizing yoke and a magnetizing yoke holding member in a magnetizing state.

FIG. 13 is a perspective view showing an example of a magnetizing yoke and a magnetizing yoke holding member in a magnetizing state. As shown in FIG. 13, the magnetizing yoke holding members 120 and 121 move horizontally in the central direction, so that the driving gear magnetizing yoke 80 is arranged at a position overlapping the permanent magnet of the driving gear 5 in a top view and the driven gear magnetizing yoke 81 is arranged at a position facing the permanent magnet of the driven gear 4. In this state, the permanent magnets of the driving gear 5 and the driven gear 4 are magnetized by applying a large current to each of the magnetizing yokes 80 and 81.

The driven gear 4 and the driven gear magnetizing yoke 81 directly face each other, but the driving gear 5 and the driving gear magnetizing yoke face each other via the magnetizing yoke holding member 120, that is, are in an overlapping state. Even in such a state, the permanent magnet of the driving gear 5 can be magnetized without any problem by configuring the magnetizing yoke holding member 120 with a material that transmits the line of magnetic force.

Further, the driving gear magnetizing yoke 80 may directly face the permanent magnet of the driving gear 5 by using a magnetizing yoke holding member that holds the driving gear magnetizing yoke 80 while covering only the side surface of the driving gear magnetizing yoke 80 or covering only the side surface and the top surface of the driving gear magnetizing yoke 80 without covering the bottom surface thereof.

When the magnetization is completed, the magnetizing yoke holding members 120 and 121 are retracted to be moved outside the driving gear 5 and the driven gear 4 and return to a standby state or a retracted state shown in FIG. 12.

Such an operation can be easily controlled by the controller 100 issuing an operation command to a drive mechanism such as a motor for driving the magnetizing yoke holding members 120 and 121.

If such an operation is performed based on the magnetic force detected by the magnetic force detectors 90 and 91, the permanent magnets of the driving gear 5 and the driven gear 4 can be magnetized at an appropriate timing, thereby continuing to perform high quality film formation without reducing throughput.

In this manner, with the film forming apparatus according to the present embodiment, the magnetic force of the permanent magnet can always be appropriately maintained, thereby continuing to perform high quality film formation.

In the present embodiment, the film forming apparatus has been described as an example, but the present disclosure can be applied to various apparatuses as long as the apparatuses are a magnetic driving apparatus using magnetic coupling using a permanent magnet.

Returning to FIGS. 1 and 2, the description of the film forming apparatus 1 will be continued. In the figures, reference symbol C denotes a central region forming portion having a circular shape in a plan view and is provided at a central portion of the lower surface of the ceiling plate 12 of the vacuum container 11. In the figures, reference numeral 34 denotes a fan-shaped protruding portion in a plan view formed so as to expand from the central region forming portion C toward the outside of the rotary table 2. In this example, two protruding portions 34 are provided apart from each other in the circumferential direction of the rotary table 2. The central region forming portion C and the protruding portions 34 form a ceiling surface lower than the outer region thereof. A $N_2$ gas is supplied from a supply passage (not shown) to a gap between the central region forming portion C and the central portion of the rotary table 2, thereby suppressing contact between the precursor gas and the oxidizing gas at the central portion of the rotary table 2.

A heater 35 for heating the wafer W is embedded in the bottom portion 14 of the container main body 13. Exhaust ports 36 and 37 are opened outside the rotary table 2 at the bottom portion 14 and is connected to a vacuum exhaust mechanism (not shown) configured by a vacuum pump or the like. A loading/unloading part 39 for the wafer W, which can be opened and closed by a gate valve 38, is formed on the side wall surface of the vacuum container 11, and a substrate is transferred inside and outside the vacuum container 11 by a transfer mechanism (not shown) via the loading/unloading part 39.

Three lifting pins 20 (not shown) are provided on the bottom portion 14 of the vacuum container 11 near the loading/unloading part 39 to deliver the wafer W between the transfer mechanism of the wafer W and the mounting table 3.

A precursor gas nozzle 61, a separation gas nozzle 62, an oxidizing gas nozzle 63, a modification gas nozzle 64 and a separation gas nozzle 65 are arranged above the rotary table 2 in this order at intervals in the rotation direction of the rotary table 2. Each of the gas nozzles 61 to 65 is formed in a rod shape extending horizontally along the radial direction of the rotary table 2 from the side wall of the vacuum container 11 toward the center thereof, and discharges various gases downward from a large number of discharge holes 66 formed at intervals along the longitudinal direction of each of the gas nozzles 61 to 65.

The precursor gas nozzle 61 discharges a BTBAS (bis-tertiarybutylaminosilane) gas as a precursor gas. In the figures, reference numeral 67 denotes a nozzle cover that covers the precursor gas nozzle 61, and has a role of increasing the concentration of the BTBAS gas below the precursor gas nozzle 61. The oxidizing gas nozzle 63 discharges an $O_3$ (ozone) gas as an oxidizing gas. The separation gas nozzles 62 and 65 discharge a $N_2$ gas, and are arranged at positions that divide the protruding portion 34 of the ceiling plate 12 in the circumferential direction when viewed from the top surface side. The modification gas nozzle 64 discharges a modification gas composed of, for example, a mixed gas of an argon (Ar) gas and an oxygen ($O_2$) gas. In this example, the precursor gas, the oxidizing gas and the modification gas each correspond to a process gas, and the precursor gas nozzle 61, the oxidizing gas nozzle 63 and the modification gas nozzle 64 each correspond to a process gas supply part.

A plasma forming part 7 is provided above the modification gas nozzle 64 so as to close an opening portion 19 formed in the ceiling plate 12 of the vacuum container 11. In FIG. 2, a position where the plasma forming part 7 is installed is indicated by a dashed line. In the figures, reference numeral 71 denotes a main body made of a dielectric material such as quartz, and reference numeral 72 denotes a protruding portion, which protrudes downward along the opening portion 19 on the lower surface of the main body 71. The modification gas is discharged from the modification gas nozzle 64 into a region surrounded by the protruding portion 72. An antenna 75 in which a metal wire is wound in a coil shape is installed on the upper surface side of the main body 71 via a Faraday shield 73 and an insulating plate member 74, and a high frequency power supply 76 is connected to the antenna 75. In the figures, reference numeral 77 denotes slits formed in the Faraday shield 73, which have the role of directing a magnetic field component of an electromagnetic field downward.

On the rotary table 2, a region below the precursor gas nozzle 61 is an adsorption region R1 where the BTBAS gas is adsorbed, and a region below the oxidizing gas nozzle 63 is an oxidizing region R2 where the BTBAS gas is oxidized. A region below the plasma forming part 7 is a modification region R3 where the $SiO_2$ film is modified by plasma. A region below the protruding portion 34 is separation regions D1 and D2 for separating the atmosphere of the adsorption region R1 and the atmosphere of the oxidizing region R2 from each other by the $N_2$ gas discharged from the separation gas nozzles 62 and 65, respectively.

The above-described exhaust port 36 is opened to the outside between the adsorption region R1 and the separation region D1 adjacent to the downstream side of the adsorption region R1 in the rotation direction to exhaust an excess BTBAS gas. Further, the exhaust port 37 is opened to the outside near the boundary between the modification region R3 and the separation region D2 adjacent to the downstream of the modification region R3 in the rotation direction to exhaust an excess $O_3$ gas and the modification gas. From the exhaust ports 36 and 37, the $N_2$ gas supplied from each of the separation regions D1 and D2 and the central region forming portion C is also exhausted.

Figure 14:
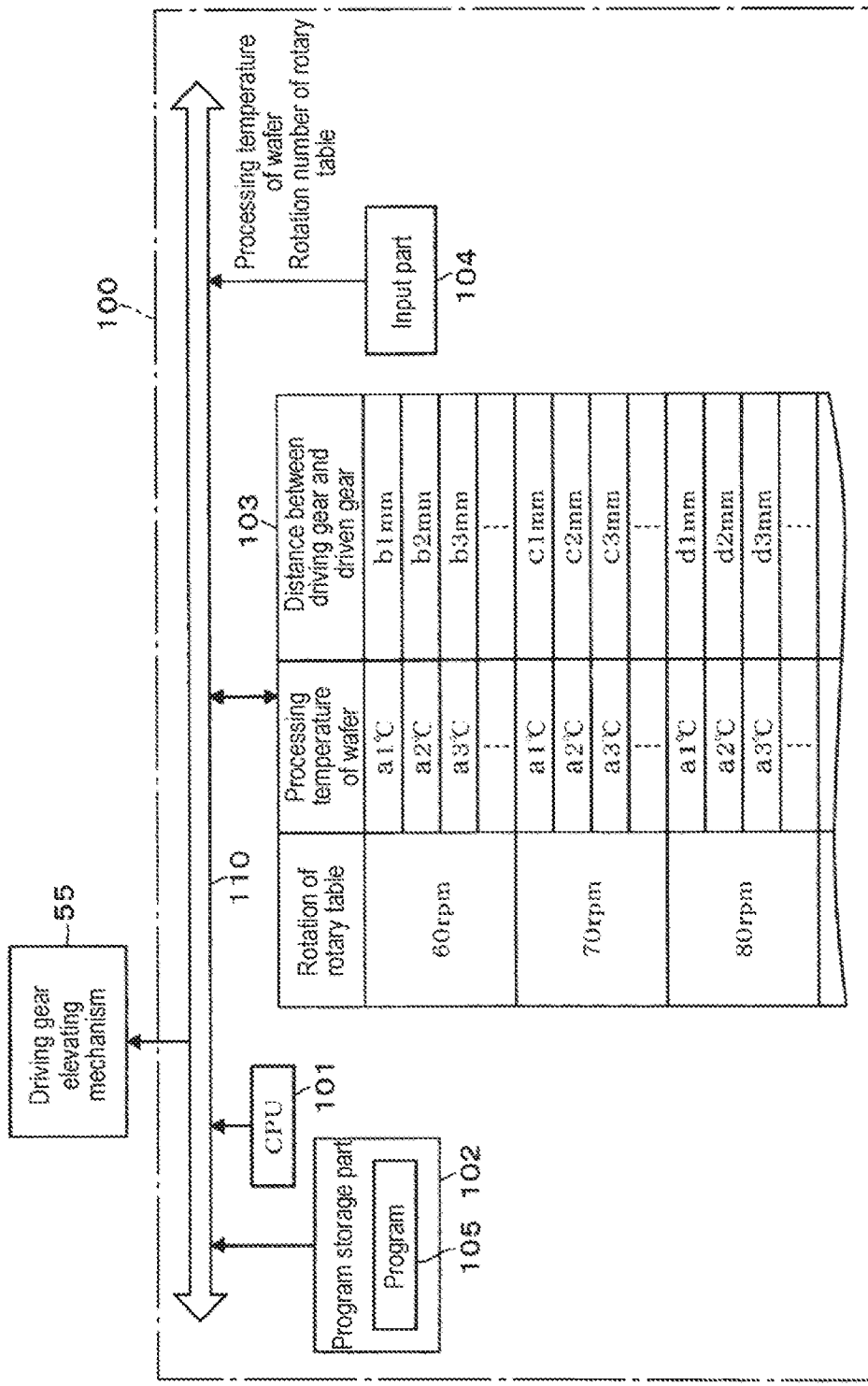
FIG. 14 is a configuration diagram showing an example of a controller installed in the film forming apparatus.

The film forming apparatus 1 is provided with the controller 100 consisting of a computer for controlling the operation of the entire apparatus, FIG. 14 shows a schematic configuration of the controller 100. The controller 100 includes a CPU 101, a program storage part 102 storing a program 105 for executing an operation related to a film forming process to be described later, a storage part 103 and an input part 104. In the figure, reference numeral 110 denotes a bus.

The storage part 103 stores the correspondence between the rotation number of the rotary table 2, the processing temperature of the water W, and the separation distance H3 between the driving gear 5 and the driven gear 4 described above. The input part 104 is a device that allows the user of the film forming apparatus 1 to input and set the rotation number of the rotary table 2 and the processing temperature of the wafer W during the film forming process as a process recipe for the wafer W. The input part 104 is configured as a touch panel or the like. The separation distance H3 corresponding to the rotation number of the rotary table 2 and the processing temperature of the wafer W thus input is read from the storage part 103, and the height of the driving gear 5 is controlled by the driving gear elevating mechanism 55 so that the height of the driving gear 5 is set to be the separation distance H3 thus read, and the film forming process is performed.

When the processing temperature of the wafer W is constant, since a higher torque is required to rotate the mounting table 3 for the reason described above as the rotation number of the rotary table 2 is higher, the separation distance H3 is set to be smaller. For example, in FIG. 14, the separation distances H3 when the rotation number of the rotary table 2 is 60 rpm, 70 rpm and 80 rpm and when the temperature of the wafer W is a1 degrees C. are represented as b1 mm, c1 mm and d1 mm, respectively, where b1>c1>d1.

Further, when the rotation number of the rotary table 2 is constant, since the demagnetization of the driving gear 5 and the driven gear 4 is more likely to occur as described above as the temperature of the wafer W is higher, the separation distance H3 is set to be smaller. For example, in FIGS. 10A and 10B, when the rotation number of the rotary table 2 is 60 rpm and the temperatures of the wafer W are a1 degrees C., a2 degrees C. and a3 degrees C., the separation distances H3 are represented as b1 mm, c1 mm and d mm, respectively, where assuming that a1 degrees C.<a2 degrees C.<a3 degrees C., b1>c1>d1.

The program 105 includes a group of steps of transmitting a control signal to each part of the film forming apparatus 1 to control the operation of each part and executing a film forming process to be described later. For example, the rotation number of the driving gear 5 by the rotation-purpose rotation mechanism 53 for rotating, the rotation number of the rotary table 2 by the revolution-purpose rotation mechanism 23, the elevation of the driving gear 5 by the driving gear elevating mechanism 55, the supply flow rate of each gas from each gas nozzle 60 to 65, the processing temperature (heating temperature) of the wafer W by the heater 35, the supply flow rate of the gas from the central region forming portion C, and the like are controlled according to the control signal. The program storage part 102 that stores the program 105 is configured by a storage medium such as a hard disk, a compact disc, a magneto-optic disk, a memory card, a DVD or the like, and the program 105 is installed in the controller 100 from the storage medium.

Subsequently, a film forming process performed by the film forming apparatus 1 will be described. For example, when the user of the film forming apparatus 1 sets the rotation number of the rotary table 2 and the processing temperature of the wafer W from the input part 104 in a state where the driving gear 5 is located at a predetermined height position, as described in FIGS. 9 and 14, the driving gear 5 moves to a height position that is the separation distance H3 corresponding to the set rotation number of the rotary table 2 and the set processing temperature of the wafer W. Subsequently, by the intermittent rotation of the rotary table 2 and the lifting operation of the lifting pins 20, the wafers W sequentially loaded into the vacuum container 11 from the outside by the transfer mechanism (not shown) are delivered to/from the mounting table 3. When the wafers W are mounted on all the mounting tables 3, the gate valve 38 is closed, and the air is exhausted from the exhaust ports 36 and 37 so that the interior of the vacuum container 11 becomes a vacuum atmosphere of a predetermined pressure. Then, a $N_2$ gas is supplied to the rotary table 2 from the separation gas nozzles 62 and 65 and the central region forming portion C. On the other hand, the temperature of the heater 35 rises to heat the wafers W to the set processing temperature. If the temperature is a high temperature of, for example, 600 degrees C. or more, the permanent magnets of the driven gear 4 and the driving gear 5 are likely to deteriorate. The heater 35 is located below the rotary table and above the driven gear 4 and the driving gear 5 but the driven gear 4 and the driving gear 5 are affected even if the driven gear 4 and the driving gear 5 are separated from a heat source. Therefore, the driven gear 4 and the driving gear 5 may often rise to about 200 degrees C.

If the magnetic force detectors 90 and 91 are installed, the magnetic force detectors 90 and 91 are turned on. When the magnetization timing is determined by the elapsed time, the operation time and the like are recorded. When the magnetic force detectors 90 and 91 detect the magnetic force of the permanent magnet of the driven gear 4 and/or the driving gear 5, monitoring can be performed in real time.

Then, the rotary table 2 is rotated at the set rotation number and, for example, the driving gear 5 is rotated at the same speed as the rotary table 2. As a result, the mounting table 3 revolves in a state where the rotation is stopped. Next, plasma formation is started by supply of each process gas from the precursor gas nozzle 61, the oxidizing gas nozzle 63 and the modification gas nozzle 64 and application of a high frequency to the antenna 75 from the high frequency power supply 76. Further, the rotation number of the driving gear 5 is changed so as to be different from the rotation number of the rotary table 2, and the mounting table 3 rotates at a predetermined rotation number.

Figure 2:
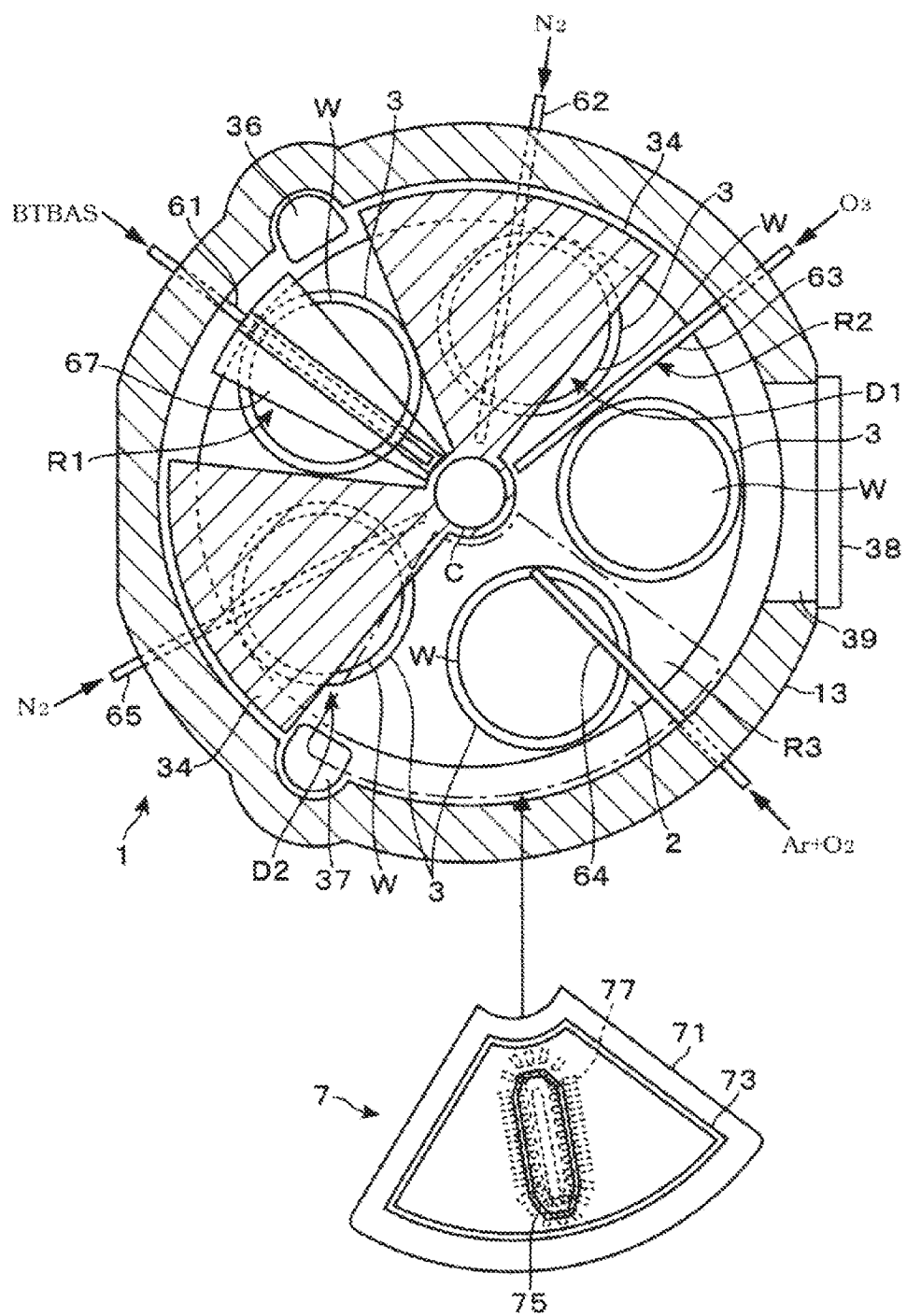
FIG. 2 is a cross-sectional plan view of the film forming apparatus.

As shown in FIG. 2, in the vacuum container 11, since the separation region D1 to which the $N_2$ gas is supplied is interposed between the adsorption region R1 and the oxidizing region R2, the precursor gas supplied to the adsorption region R1 and the oxidizing gas supplied to the oxidizing region R2 are exhausted without being mixed with each other on the rotary table 2. Further, since the separation region D2 to which the $N_2$ gas is supplied is interposed between the adsorption region R1 and the modification region R3, the precursor gas, the modification gas supplied to the modification region, and the oxidizing gas directing from the upstream side of the modification region R3 in the rotation direction toward the separation region D2 are exhausted through the exhaust ports 36 and 37 without being mixed with each other on the rotary table 2. Further, the $N_2$ gas supplied from the central region forming portion C is also exhausted through the exhaust ports 36 and 37.

In a state where the supply and exhaust of each gas have been performed as described above, each wafer W sequentially passes through the adsorption region R1, the oxidizing region R2 and the modification region R3. In the adsorption region R1, the BTBAS gas discharged from the precursor gas nozzle 61 is adsorbed on the wafer W. In the oxidizing region R2, the adsorbed BTBAS gas is oxidized by the $O_3$ gas supplied from the oxidizing gas nozzle 63 to form one or more molecular layers of $SiO_2$. In the modification region R3, the $SiO_2$ molecular layers are modified by being exposed to the plasma of the modification gas. By rotating the rotary table 2, the above-described cycle is repeatedly performed plural times, whereby the $SiO_2$ molecular layers are stacked to form a $SiO_2$ film on the surface of the wafer W. FIGS. 11A and 11B show the operation of each part of the film forming apparatus 1 when the film formation is performed as described above.

In the film forming apparatus 1, the wafer W is rotated by the rotation of the mounting table 3 in parallel with the rotation of the rotary table 2, but the rotation number of the rotary table 2 and the rotation speed of the mounting table 3 are set such that the rotation of the rotary table 2 and the rotation of the mounting table 3 are not synchronized. That is, assuming that the rotary table 2 makes one rotation from a start point of rotation in a state where the wafer W is set to a first orientation and is again located at the start point, a rotation speed of the wafer W is set such that the wafer W is set to a second orientation different from the first orientation after the one rotation of the rotary table 2 is made.

In this manner, since the mounting table 3 rotates without being synchronized with the rotation of the rotary table 2, the wafer W on each mounting table 3 passes through the adsorption region R1 of the precursor gas in various orientations by the rotation and the revolution. Thus, with the rotation of the mounting table 3, the cycle of forming the above-described $SiO_2$ molecular layer is performed while gradually changing the orientation as viewed from the top surface side. Since the film formation is performed while changing the orientation of the wafer W, for example, even when the concentration distribution of the precursor gas is varied in the adsorption region R1, the amount of precursor gas adsorbed on the wafer W can be made uniform in the circumferential direction of the wafer W in the entire period of the formation cycle of the $SiO_2$ molecular layer performed plural times. As a result, the deviation in the thickness of the $SiO_2$ film formed on the wafer W when viewed in the circumferential direction of the wafer W can be suppressed.

By the above-described operation, the molecular layers of $SiO_2$ are sequentially stacked. After a predetermined number of cycles are executed, the rotation of the rotary table 2, the rotation of the driving gear 5, the supply of various gases and the formation of plasma are stopped and the film forming process ends. Thereafter, the wafer W is unloaded from the vacuum container 11 in a procedure reverse to the procedure for loading the wafer W into the vacuum container 11.

When such a film forming process is repeated to reduce the magnetic force of the permanent magnet used for the driven gear 4 and the driving gear 5, a magnetizing process described with reference to FIGS. 10A to 13 is performed.

Figure 15:
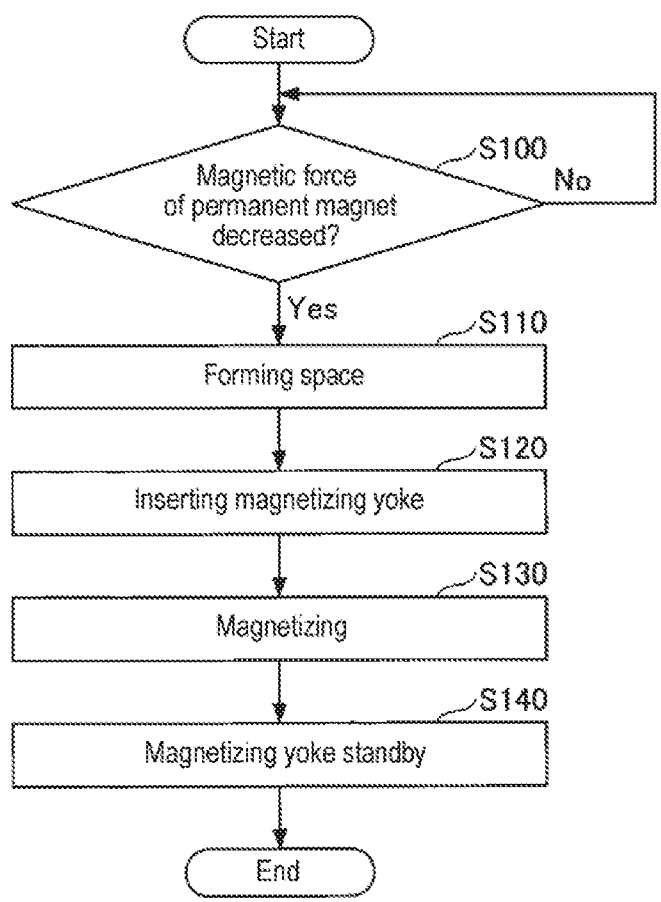
FIG. 15 is a flowchart for explaining a magnetizing method according to an embodiment of the present disclosure.

FIG. 15 is a flowchart for explaining a magnetizing method according to the present embodiment.

In step S100, it is determined whether or not the magnetic force of the permanent magnets of the driving gear 5 and the driven gear 4 has decreased. Specifically, it is determined whether or not the magnetic force of the permanent magnet is equal to or less than a predetermined threshold value, or whether or not the magnetic force of the permanent magnet is less than the threshold value. In the case of time management, it is determined whether or not a predetermined time has elapsed.

In the case of the determination based on the lapse of time, a time when the permanent magnet is deteriorated is checked in advance, and when the operation time reaches the time, it is determined that the permanent magnet has been deteriorated.

On the other hand, in the case of the determination based on the threshold value, the magnetic force of the permanent magnet is measured. As described with reference to FIGS. 10A to 13, the magnetic force of the permanent magnet may be measured by using the magnetic force detectors 90 and 91 incorporated in the driving gear 5 or the like, or by using an insertion-type magnetometer.

When it is determined that the magnetic force of the permanent magnet has not decreased, the loop is repeated in the state of step S100. When it is determined that the magnetic force has decreased, the process proceeds to step S110.

In step S110, a space is formed between the driving gear 5 and the driven gear 4. Specifically, the driving gear 5 descends to form a space with the driven gear 4. Note that, when the magnetic force detectors 90 and 91 are used to detect a decrease in magnetic force during the film forming process, it is not necessary to stop the film forming process being performed. When the film forming process under execution ends, step S110 may be executed.

In step S120, the driving gear magnetizing yoke 80 and the driven gear magnetizing yoke 81 are inserted into the space. Note that the driving gear magnetizing yoke 80 and the driven gear magnetizing yoke 81 may not be inserted into the space at the same time, and only one of them may be inserted.

That is, when only the driving gear 5 has a reduced magnetic force, only the driving gear magnetizing yoke 80 may be inserted. Further, even if the magnetic forces of both the permanent magnets of the driving gear 5 and the driven gear 4 are reduced, a magnetizing process of one of the driving gear 5 and the driven gear 4 may be performed first, and a magnetizing process of the other one of the driving gear 5 and the driven gear 4 may be performed thereafter.

The insertion positions of the driving gear magnetizing yoke 80 and the driven gear magnetizing yoke 81 are positions where the driving gear magnetizing yoke 80 faces or overlaps the permanent magnet of the driving gear 5 and where the driven gear magnetizing yoke 81 faces or overlaps the permanent magnet of the driven gear 4, respectively.

The insertion is performed by moving the magnetizing yoke holding members 120 and 121 holding the driving gear magnetizing yoke 80 and the driven gear magnetizing yoke 81 from a predetermined standby position provided outside the driving gear 5 and the driven gear 4 toward the center of the rotary table 2 and arranging them at a predetermined magnetizing position.

In step S130, a current is applied to the driving gear magnetizing yoke 80 and the driven gear magnetizing yoke 81 to generate a magnetic field and magnetize the permanent magnet.

In step S140, when the magnetization is completed, the magnetizing yoke holding members 120 and 121 holding the driving gear magnetizing yoke 80 and the driven gear magnetizing yoke 81 are moved outward and arranged at a predetermined standby position.

In this manner, since the magnetization in the magnetic drive apparatus and the magnetizing method according to the present embodiment can be performed between the film forming processes and thus the film forming apparatus 1 does not need to be disassembled and the magnetization can be easily and quickly performed, the productivity can be improved. Further, since the film forming process is not performed in a state where the magnetic force of the permanent magnets used for the driven gear 4 and the driving gear 5 is reduced, the film quality can be kept uniform and high.

Next, a method of manufacturing a magnetic drive apparatus to which the magnetizing method according to the present embodiment is applied will be described. The method of re-magnetizing the permanent magnet has been described in FIGS. 10A to 13. Assembling the driving gear 5 and the driven gear 4 using the permanent magnet is very difficult because the permanent magnet has a very high magnetic force. That is, when assembling the film forming apparatus 1, since a strong attractive force acts between permanent magnets, a great deal of labor is required to peel them off when they stick to each other. Therefore, when assembling, an insulating jig is provided between magnets, and careful attention is paid to assembling the permanent magnets with much labor so that the permanent magnets do not stick to each other.

In order to solve this, in the method of manufacturing the magnetic drive apparatus according to the present embodiment, assembling is performed using a magnetizable magnetic material without generating a magnetic force.

That is, the film forming apparatus 1 is manufactured by assembling the driven gear 4 and the driving gear 5 made of a magnetic material. After the assembling, the driving gear 5 and the driven gear 4 are magnetized in the same manner as the magnetizing method according to the present embodiment, and the permanent magnets are formed at predetermined locations. At this time, the magnetizing apparatus including the driving gear magnetizing yoke 80 and the driven gear magnetizing yoke 81 is not a magnetizing apparatus for re-magnetizing the permanent magnet, but a strong magnetizing apparatus used when manufacturing the magnet first. The magnetizing method itself is the same as that described with reference to FIGS. 10A to 14.

According to the method of manufacturing a film forming apparatus, the manufacturing of the film forming apparatus 1 can be easily performed, thereby improving the productivity of assembling and manufacturing. When the magnetic force of the permanent magnet of the film forming apparatus manufactured thus decreases, the magnetizing method described with reference to FIGS. 10A to 13 may be performed to recover the magnetic force of the permanent magnet.

In the film forming apparatus 1 described above, the separation distance H3 is changed by raising and lowering the driving gear 5 with respect to the revolution of the driven gear 4, but the separation distance H3 may be changed by raising and lowering the driven gear 4 with respect to the driving gear 5. Specifically, for example, the revolution-purpose rotation mechanism 23 is connected to the elevating mechanism to move up and down the rotary table 2 and the vacuum container 11, so that the driven gear 4 can be moved up and down with respect to the driving gear 5.

The magnetic gear mechanism 40 including the driving gear 5 and the driven gear 4 may be configured such that the driven gear 4 rotates in accordance with the rotation of the driving gear 5 by a magnetic force in a non-contact manner with the driving gear 5, Therefore, only one of the driven gear 4 and the driving gear 5 may be a magnetic material.

Further, the driven gear 4 or the driving gear 5 is not limited to the configuration in which the N-pole portion and the S-pole portion are alternately arranged. For example, the driven gear 4 or the driving gear 5 may be configured by only one of the S-pole portion and the N-pole portion. However, in the driven gear 4 and the driving gear 5, by alternately arranging different magnetic poles as in the above-described embodiment, the mounting table 3 rotates by using the repulsive force and the attractive force of the magnet, which is preferable because the mounting table 3 can be reliably rotated. Further, as long as the driven gear 4 can be rotated by the rotation of the driving gear 5, the shape of each magnetic pole portion is not limited to a rectangular shape as in the above-described example.

In this way, the driving gear 5 and the driven gear 4 can have various configurations as long as the mounting table can be rotated by magnetic coupling of the driving gear 5 and the driven gear 4. Further, in the present embodiment, an example has been described in which the magnetic drive apparatus is configured as the film forming apparatus 1. However, the present disclosure can be applied to other substrate processing apparatuses, and can be applied to various apparatuses as long as they have a magnetic drive mechanism and are driven using magnetic coupling.

According to the present disclosure in some embodiments, it is possible to recover the magnetic force of a magnetic drive mechanism using a magnet to thereby keep the operation of the magnetic drive mechanism constant.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A magnetic drive apparatus comprising:
   a rotary table configured to mount substrates in substrate mounting regions formed on the rotary table along a circumferential direction of the rotary table;
   a magnetic gear mechanism configured to rotate the substrate mounting regions, the magnetic gear mechanism including;
      driven gears having first magnets which are permanent magnets; and
      a driving gear having second magnets which face the first magnets and are permanent magnets magnetically coupled to the first magnets in a non-contact manner by a magnetic force generated between the first magnets and the second magnets, and configured to rotate the first magnets by the magnetic force;
   a first magnetizing yoke which is an electromagnet and disposed at a first standby position outside the driven gears in a plan view;
   a second magnetizing yoke which is an electromagnet and disposed at a second standby position outside the driving gear in a plan view;

a first magnetizing yoke holder configured to hold the first magnetizing yoke, and configured to move the first magnetizing yoke between the first standby position and a first magnetizing position overlapping the driven gears in a plan view;

a second magnetizing yoke holder configured to hold the second magnetizing yoke, and configured to move the second magnetizing yoke between the second standby position and a second magnetizing position overlapping the driving gear in a plan view; and a controller programmed to:
when the first magnetizing yoke and the second magnetizing yoke are respectively placed at the first standby position and the second standby position, determine whether the magnetic force between the first magnets and the second magnets is lower than a threshold value;

when the magnetic force is determined to be lower than the threshold value, place the first magnetizing yoke at the first magnetizing position and the second magnetizing yoke at the second magnetizing position by moving the first magnetizing yoke and the second magnetizing yoke by the first magnetizing yoke holder and the second magnetizing yoke holder, respectively; and magnetize the first magnets and the second magnets by applying currents to the first magnetizing yoke placed at the first magnetizing position and the second magnetizing yoke placed at the second magnetizing position, respectively.

2. The magnetic drive apparatus of claim 1, further comprising a magnetic force detector configured to detect the magnetic force between the first magnets and the second magnets,
wherein the controller is further configured to determine whether the magnetic force is lower than the threshold value based on the detection result by the magnetic force detector.

3. The magnetic drive apparatus of claim 2,
wherein the magnetic gear mechanism is provided below the rotary table.

4. The magnetic drive apparatus of claim 3, further comprising a nozzle configured to supply a process gas to the rotary table.

5. The magnetic drive apparatus of claim 3, further comprising rotation shafts extending downward from central portions of bottom surfaces of the substrate mounting regions, respectively,
wherein center axes of the driven gears are aligned with center axes of the rotation shafts, respectively, and wherein the first magnets are embedded in each of the driven gears along a circumferential direction of each of the driven gears.

6. The magnetic drive apparatus of claim 5, further comprising a nozzle configured to supply a process gas to the rotary table.

7. The magnetic drive apparatus of claim 1,
wherein the magnetic gear mechanism is provided below the rotary table.

8. A magnetizing method for use in the magnetic drive apparatus of claim 1, comprising:
magnetically driving the magnetic drive apparatus; and
when the first magnetizing yoke and the second magnetizing yoke are placed at the first standby position and the second standby position, respectively, magnetizing the first magnets and the second magnets by applying currents to the first magnetizing yoke placed at the first magnetizing position and the second magnetizing yoke placed at the second magnetizing position, respectively.

9. The magnetizing method of claim 8, wherein the first and second magnetizing yokes are disposed at the first and second standby positions, respectively, when the magnetic gear mechanism is magnetically driven, and
wherein the magnetizing the first magnets and the second magnets further includes placing the first magnetizing yoke at the first magnetizing position and the second magnetizing yoke at the second magnetizing position by moving the first magnetizing yoke and the second magnetizing yoke by the first magnetizing yoke holder and the second magnetizing yoke holder, respectively.

10. The magnetizing method of claim 8, further comprising:
detecting the magnetic force between the first magnets and the second magnets;
determining whether the detected magnetic force is lower than a threshold value,
wherein the magnetizing the first magnets and the second magnets is performed when the detected magnetic force is determined to be lower than the threshold value.

11. The magnetizing method of claim 8, wherein the magnetic drive apparatus performs substrate processing by rotating the substrates mounted in the substrate mounting regions by magnetically driving the magnetic gear mechanism, and
wherein the magnetizing the first magnets and the second magnets is performed when no substrate is disposed in a processing chamber of the magnetic drive apparatus.

* * * * *